United States Patent
Sui et al.

(10) Patent No.: US 10,792,657 B2
(45) Date of Patent: Oct. 6, 2020

(54) MICROFLUIDIC DEVICES HAVING TOP AND BOTTOM LAYERS OF GRAPHENE AND A MIDDLE LAYER WITH A PATTERNED CAVITY

(71) Applicant: University of Massachusetts, Boston, MA (US)

(72) Inventors: Shuo Sui, Amherst, MA (US); Yuxi Wang, Amherst, MA (US); Christos Dimitrakopoulos, Amherst, MA (US); Sarah L. Perry, Belchertown, MA (US)

(73) Assignee: University of Massachusetts, Boston, MA (US)

(*) Notice: Subject to any disclaimer, the term of this patent is extended or adjusted under 35 U.S.C. 154(b) by 156 days.

(21) Appl. No.: 15/830,768

(22) Filed: Dec. 4, 2017

(65) Prior Publication Data
US 2018/0214863 A1    Aug. 2, 2018

Related U.S. Application Data

(60) Provisional application No. 62/430,005, filed on Dec. 5, 2016.

(51) Int. Cl.
| | |
|---|---|
| *B01L 3/06* | (2006.01) |
| *B01L 3/00* | (2006.01) |
| *C30B 7/14* | (2006.01) |
| *C30B 29/58* | (2006.01) |
| *G01N 23/20025* | (2018.01) |
| *G01N 23/207* | (2018.01) |

(52) U.S. Cl.
CPC ............. *B01L 3/06* (2013.01); *B01L 3/5027* (2013.01); *B01L 3/502707* (2013.01); *C30B 7/14* (2013.01); *C30B 29/58* (2013.01); *G01N 23/207* (2013.01); *G01N 23/20025* (2013.01); *B01L 2200/10* (2013.01); *B01L 2200/12* (2013.01); *B01L 2300/0609* (2013.01); *B01L 2300/0887* (2013.01); *B01L 2300/12* (2013.01); *G01N 2223/602* (2013.01)

(58) Field of Classification Search
CPC .. C30B 7/00; C30B 7/14; C30B 29/58; Y10T 117/00; Y10T 117/10; Y10T 117/1004; Y10T 117/1008; Y10T 117/1012; Y10T 117/1024; G01N 23/20025; G01N 23/207; G01N 2223/602; B01L 3/06; B01L 3/5027; B01L 2300/0609; B01L 2300/0887; B01L 2300/12; B01L 2200/10; B01L 2200/12
USPC ...................... 117/11, 68–69, 200–203, 206
See application file for complete search history.

(56) References Cited

U.S. PATENT DOCUMENTS

| | | | | |
|---|---|---|---|---|
| 2013/0120747 A1* | 5/2013 | Chan | ................. | B01L 3/502707 356/246 |
| 2015/0118126 A1* | 4/2015 | Khalid | ................... | H01J 37/26 422/503 |

OTHER PUBLICATIONS

Dui, et al. "Graphene-based microfluidics for serial crystallography" Lab Chip, 2016,16, 3082-3096.

* cited by examiner

*Primary Examiner* — Kenneth A Bratland, Jr.
(74) *Attorney, Agent, or Firm* — Milstein Zhang & Wu LLC

(57) ABSTRACT

This invention provides microfluidic devices with graphene films as architectural materials and methods of fabrication and use thereof in X-ray analysis.

10 Claims, 24 Drawing Sheets

1. Graphene Transfer

2. Layer Assembly

FIG. 22A
FIG. 22B
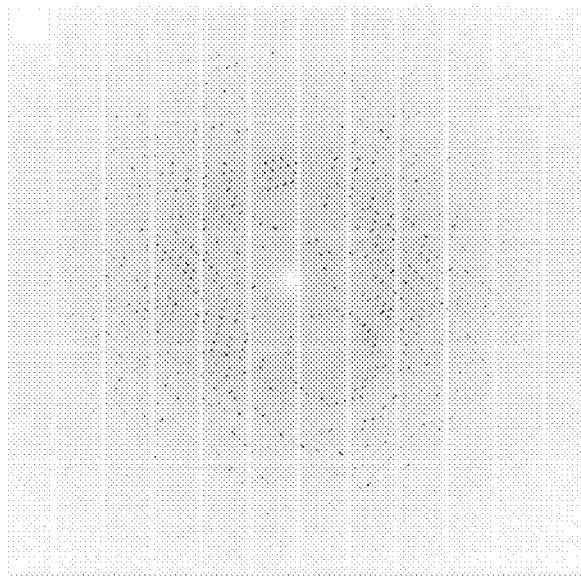
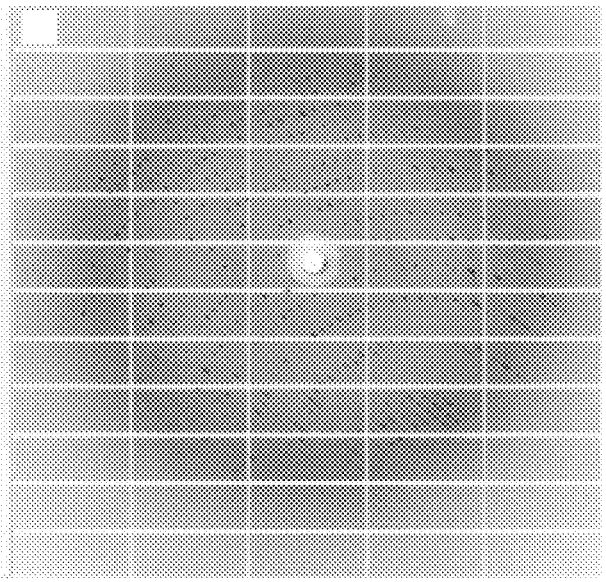

MICROFLUIDIC DEVICES HAVING TOP AND BOTTOM LAYERS OF GRAPHENE AND A MIDDLE LAYER WITH A PATTERNED CAVITY

PRIORITY CLAIMS AND RELATED PATENT APPLICATIONS

This application claims the benefit of priority to U.S. Provisional Application Ser. No. 62/430,005, filed on Dec. 5, 2016, the entire content of which is incorporated herein by reference in its entirety.

TECHNICAL FIELDS OF THE INVENTION

The invention generally relates to microfluidic devices and X-ray analysis. More particularly, the invention relates to microfluidic devices with graphene films as architectural materials and methods of fabrication and use thereof in X-ray analysis of target materials including biomolecules.

BACKGROUND OF THE INVENTION

One goal of the microfluidic technology is to enhance the diffraction signal from protein crystals and specially benefits that of micro-crystals. The signal enhancement comes from a reduction in the level of signal attenuation and background scatter associated with the solvent or mounting support surrounding the crystal. Smaller crystals may have a lower probability of defects, and thus have the potential to yield higher quality diffraction data. Furthermore, micro-crystals are critical to enable aspects of time-resolved protein crystallography. (Smith, et al. *Curr. Opin. Struct. Biol.*, 2012, 22, 602-612; Axford, et al. *Acta Crystallogr. Sect. D: Biol. Crystallogr.*, 2012, 68, 592-600; Cusack, et al. *Nat. Struct. Mol. Biol.*, 1998, 5, 634-637; Riekel, *NanoWorld J*, 2015, 1, 71-76; Kupitz, et al. *Philos. Trans. R. Soc., B*, 2014, 369, 20130316; Lyubimov, et al. *Acta Crystallogr., Sect. D: Biol. Crystallogr.*, 2015, 71, 928-940; Schmidt, *Adv. Condens. Matter Phys.*, 2013, 2013, 167276.)

However, illumination of a smaller crystal volume with a greater X-ray flux increases the level of radiation damage experienced by the sample, and can dramatically decrease the usable lifetime of the crystal. In the case of next-generation, ultra-brilliant X-ray free-electron lasers (XFELs), the X-ray beam is so intense that the crystal is destroyed after a single X-ray pulse. (Chapman, et al. *Philos. Trans. R. Soc., B*, 2014, 369, 20130313; Hunter, et al. *Methods*, 2011, 55, 387-404.)

One approach to reduce radiation damage and sample deterioration is through a serial approach to protein crystallography. This approach involves collection of data from a large number of independent volumes on a larger crystal, which has transitioned recently to the collection of as little as a single frame of data from many smaller crystals. Complete datasets can then be obtained by merging data from hundreds, thousands, or even tens of thousands of crystals. This data collection strategy, however, suffers from the need to grow and efficiently manipulate a large number of fragile micro-crystals. Reported methods have mostly focused on transferring a pre-prepared slurry of micro-crystals onto a mount or into an injector. This requirement for physical handling introduces the need for additional experimental procedures, can potentially damage fragile or sensitive crystals, and particularly in the case of micro-crystal injection jets, can lead to inefficient sample utilization. (Hunter, et al. *Methods*, 2011, 55, 387-404; Chapman, et al. *Nature*, 2011, 469, 73-77; Hirata, et al. *Nat. Methods*, 2014, 11, 734-736. Lyubimov, et al. *Acta Crystallogr. Sect. D: Biol. Crystallogr.*, 2015, 71, 928-940. Tenboer, et al. *Science*, 2014, 346, 1242-1246.)

Thus, major challenges remain in microfluidic X-ray analysis and protein crystallography. Novel strategies and methodologies are urgently needed.

SUMMARY OF THE INVENTION

The invention provides a revolutionary approach to microfluidic X-ray analysis (e.g., X-ray crystallography). Particularly, the unconventional strategy allows the growth and subsequent serial crystallographic analysis of micro-crystals, which facilitate both structural characterization and dynamic structural studies of protein targets.

The invention provides an ultra-thin X-ray compatible microfluidic platform that allows on-chip X-ray diffraction analysis of protein crystals with negligible contributions from the device materials. A straightforward method was developed for the incorporation of large-area, one or a stack of single-layer graphene films to serve as both X-ray compatible windows and as a diffusion barrier to prevent evaporative losses from the device.

In one aspect, the invention generally relates to a microfluidic device. The microfluidic device includes: a top layer comprising a top support layer and one or more top layer(s) of graphene, a bottom layer comprising a bottom support layer and one or more bottom layer(s) of graphene, and a middle layer sandwiched between the top layer and the bottom layer having a patterned cavity defining a sample holding chamber. The top layer exhibits an optically clear top window area comprising at least a portion of the top layer(s) of graphene. The bottom layer exhibits an optically clear bottom window area comprising at least a portion of the bottom layer(s) of graphene.

In another aspect, the invention generally relates to a method for fabricating a microfluidic device. The method includes: providing a first graphene film comprising one or more layer(s) of graphene and a second graphene film comprising one or more layer(s) of graphene; coating the first graphene film and the second graphene film with a layer of a material resistant to exposure to ferric chloride; transferring the coated first graphene film to a support layer forming a top layer with a window area defined by the first graphene film; transferring the coated second graphene film to a support layer forming a bottom layer with a window area defined by the second graphene film; providing a middle layer exhibiting a pattern (e.g., a cut-out, 3D printed, or lithographically defined pattern); and forming the microfluidic device by bonding the middle layer to and between the top and the bottom layers to form a sandwiched construct having a cavity defined by the top and bottom layers and the pattern of the middle layer.

In yet another aspect, the invention generally relates to a method of X-ray analysis (e.g., diffraction). The method includes: growing one or more microcrystals in the sample chamber of a microfluidic device disclosed herein; directing an X-ray beam to the one or more microcrystals via the top or bottom window of the microfluidic device; and measuring the X-ray diffraction of the one or more microcrystals via the bottom or top window of the microfluidic device.

In yet another aspect, the invention generally relates to a method for introduction of a sample into the microfluidic sample chamber for subsequent X-ray analysis (e.g., diffraction, small-angle scattering, wide-angle scattering).

These and other features, aspects and advantages of the present invention will become better understood with reference to the following drawings, description and claims.

BRIEF DESCRIPTION OF THE DRAWINGS

FIG. 2A CVD-grown graphene on copper is first coated with a layer of PMMA, and then released from the copper substrate by etching. The subsequent film is floated on the surface of water for FIG. 2B transfer to an adhesive polyester support layer to define the window areas of the device. This layer is then adhered to a COC layer containing the cut-out, 3D printed, or lithographically-defined pattern for the microfluidic channels. FIG. 2C A hydrophilic PDA surface treatment on both the top PMMA/graphene film and the bottom layer containing the microfluidic channel can facilitate easy filling of the final device via capillary action, if needed. FIG. 2D The final, assembled device is held together by the adhesive layers defining the window structures, leaving the PMMA/graphene window areas free of excess material. Either microbatch or counter-diffusion crystallization trials can be set up by the addition of protein and precipitant solutions. The device inlets are sealed with Crystal Clear tape.

FIG. 11A, FIG. 11B A comparison of the level of background scattering resulting from a 1.5 μs polychromatic X-ray pulse train interacting with the air background, as well as varying thicknesses of PMMA with graphene, PDA surface treatment, and a 100 μm COC layer as a function of q-space FIG. 11A or d-spacing FIG. 11B. While the presence of thin polymeric films does increase the overall signal, the impact of either 180 nm A2 or 500 nm A4 PMMA is significantly lower than the larger signal resulting from 100 μm COC. The improvements in signal are due in part to the decrease in overall thickness, as well as the absence of the characteristic scattering bands observed for COC (green), above the overall shape of the amorphous background. A similar comparison is given in FIG. 11C, FIG. 11D showing the negligible effect of a single layer of graphene on a 180 nm A2 PMMA film.

FIG. 16A Firstly, CVD-grown graphene on copper is first coated with a layer of PMMA, followed by etch-releasing from the copper substrate. The subsequent film is floated on the surface of water for FIG. 16B transfer to an adhesive polyester support layer to define the window areas of the device. This layer is then adhered to a COC layer containing the cut-out, 3D printed, or lithographically defined pattern for the well. FIG. 16C A hydrophilic PDA surface treatment of both the top PMMA/graphene film and the bottom layer containing the crystallization chamber can facilitate wetting of the final device, if needed. FIG. 16D The final, assembled device is held together by the adhesive layers defining the window structures, leaving the PMMA/graphene window areas free of excess material. Microbatch trials can be set up by the addition of protein and precipitant solutions prior to sealing the device. Photographs of an empty and a filled device (green food coloring used for visualization purposes) are also shown.

FIG. 22A and FIG. 22B. Monochromatic data visualized using X-ray data collection software.

DEFINITIONS

Figure 1:
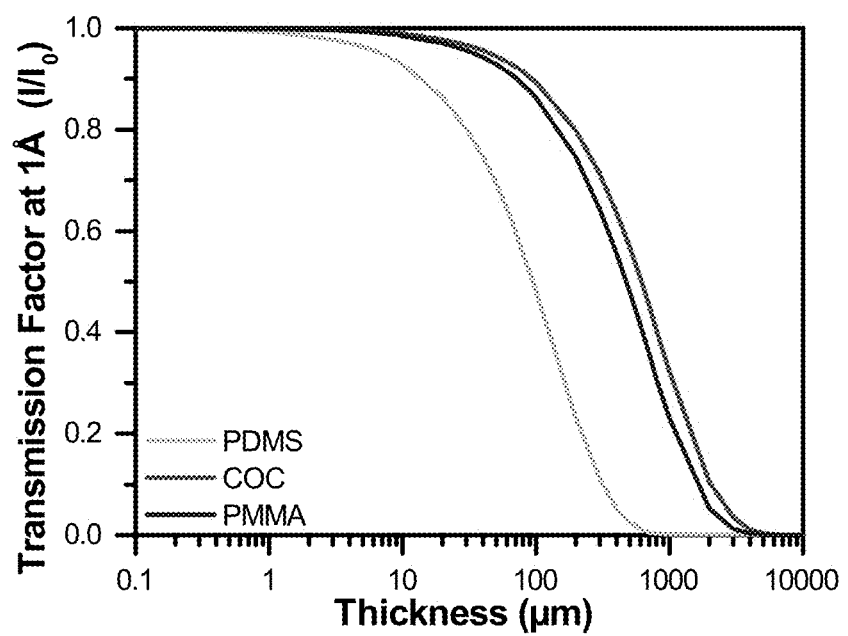
FIG. 1. A comparison of the transmission factors $I/I_0$ for varying thicknesses of PDMS, COC, and PMMA at an X-ray energy of 12.4 keV, or a wavelength of 1 Å.
Figure 2A:
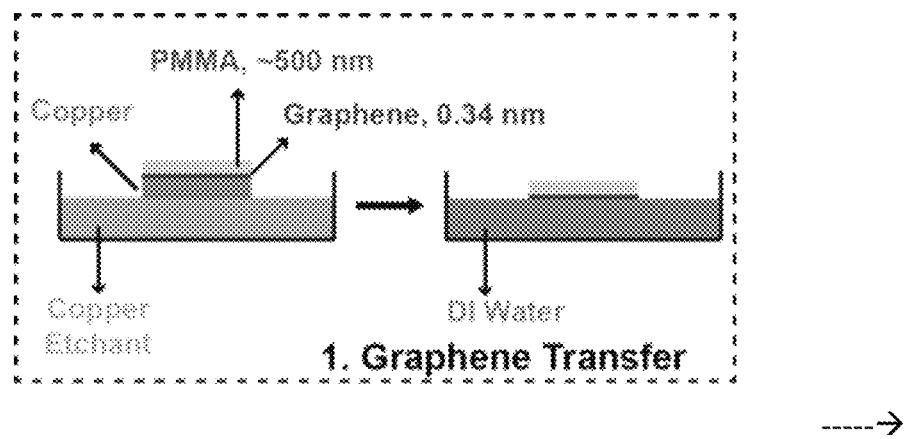
FIG. 2A-2D. Schematic depiction of the fabrication scheme for thin-film graphene-based microfluidics, using a channel-based counter-diffusion as the example.
Figure 2B:
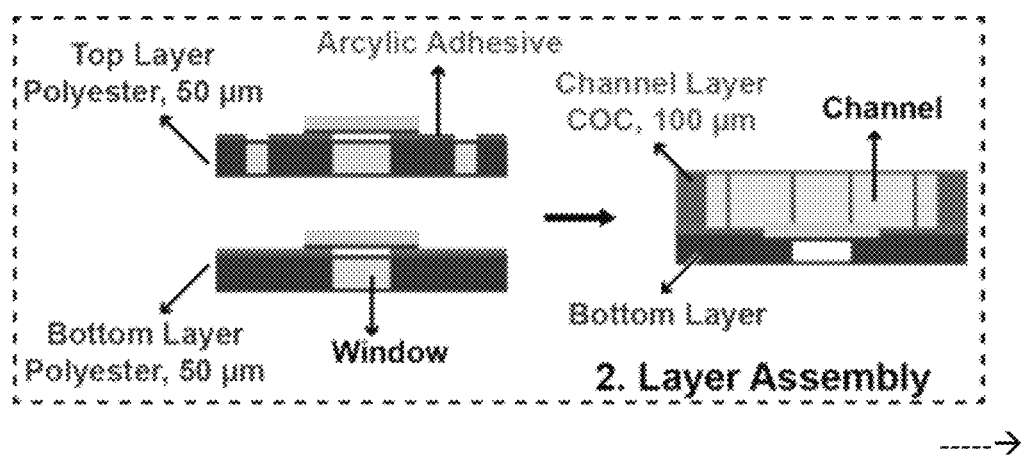
Figure 2C:
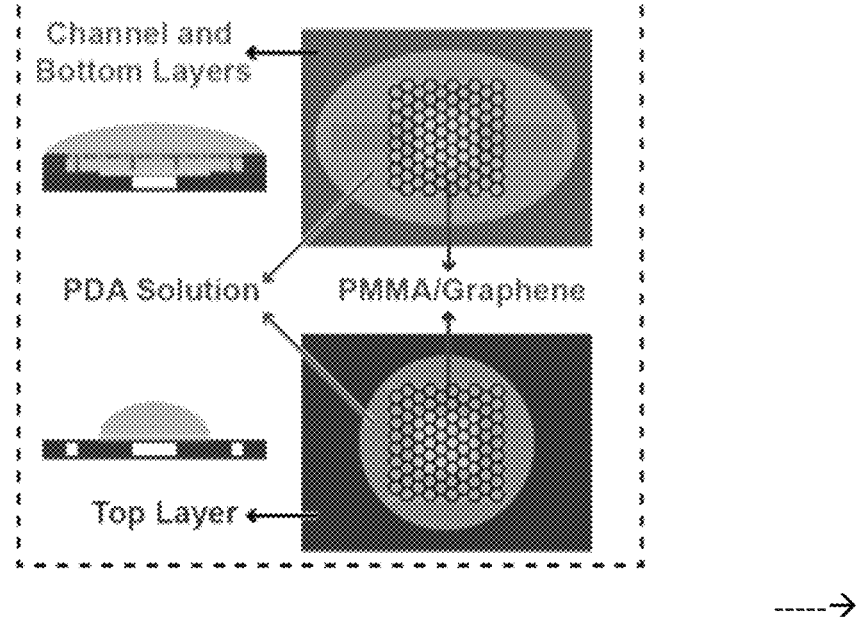
Figure 2D:
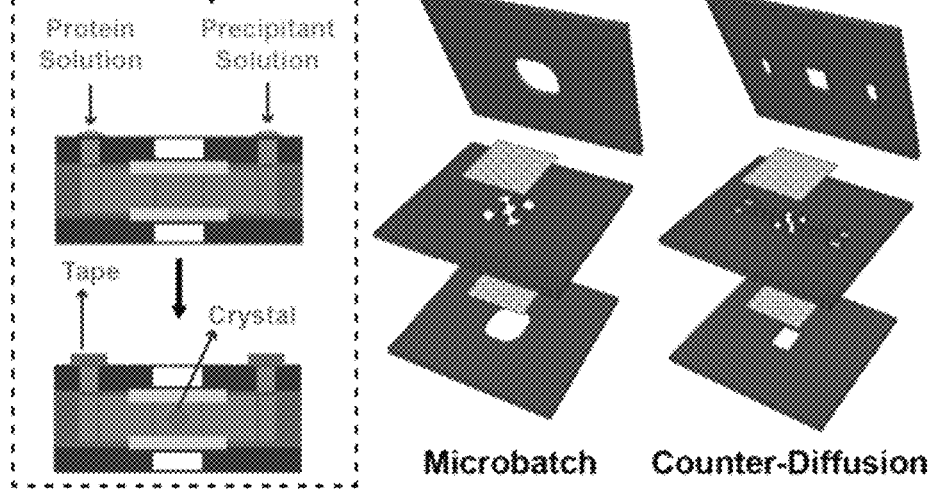

The definitions below are provided as summaries of concepts that are commonly understood by one of ordinary skill in the relevant art and are provided for the purposes of understanding of the subject matter disclosed herein. The definitions are not meant to be limitations of the invention or claims herein.

The term "graphene", as used herein, refers to a carbon-based material characterized by an allotrope of carbon in the form of a two-dimensional, atomic-scale, honeycomb lattice wherein a carbon atom forms each vertex.

As used herein, the terms "protein" and "polypeptide" are used interchangeably to refer to a polymer of amino acid residues, and are not limited to a minimum length. Thus, peptides, oligopeptides, dimers, multimers, and the like, are included within the definition. Both full-length proteins and fragments thereof are encompassed by the definition. The terms also include post-expression modifications of the polypeptide, for example, glycosylation, acetylation, phosphorylation, and the like. Furthermore, a "polypeptide" may refer to a protein that includes modifications, such as deletions, additions, and substitutions (generally conservative in nature), to the native sequence, as long as the protein maintains the desired activity. These modifications may be deliberate or may be accidental.

The term "nucleic acid," as used herein, refers to polymeric forms of nucleotides of any length. They can include both double- and single-stranded sequences and include, but are not limited to, cDNA from viral, prokaryotic, and eukaryotic sources; mRNA; genomic DNA sequences from viral (e.g., DNA viruses and retroviruses) or prokaryotic sources; RNAi; cRNA; antisense molecules; ribozymes; and synthetic DNA sequences. The term also captures sequences that include any of the known base analogs of DNA and RNA.

The term "polysaccharide," as used herein, refers to a polymer comprising a plurality (i.e., two or more) of covalently linked saccharide residues. Linkages may be natural or unnatural. Natural linkages include, for example, glycosidic bonds, while unnatural linkages may include, for example, ester, amide, or oxime linking moieties. Polysaccharides may have any of a wide range of average molecular weight (MW) values, but generally are of at least about 100 daltons. Polysaccharides may have straight chain or branched structures. Polysaccharides may include fragments of polysaccharides generated by degradation (e.g., hydrolysis) of larger polysaccharides.

DETAILED DESCRIPTION OF THE INVENTION

The invention provides a revolutionary approach to microfluidic-based X-ray crystallography. The unconventional strategy allows the growth and subsequent serial crystallographic analysis of micro-crystals and offers the potential to facilitate both structural characterization and dynamic structural studies of protein targets.

Disclosed herein is a straightforward method for the incorporation of single-layer graphene into ultra-thin, X-ray compatible microfluidic devices. The utility of graphene has been demonstrated as a diffusion barrier to mitigate the effects of evaporation over the course of several weeks. Further validated is the approach via the on-chip structure determination of hen egg white lysozyme (HEWL) as a model system to facilitate quantification of the effects of device thickness on the signal-to-noise of the diffraction measurement and subsequent structure determination efforts. Data obtained using proteins, for example, Caspase 7 and trypsin, further confirmed this method. These graphene-enhanced, ultra-thin device fabrication strategies hold tremendous promise for enabling the on-chip crystallization and subsequent serial crystallographic analysis of micro-crystals at synchrotron sources, and can be further scaled to enable the analysis of nano-crystals at XFELs.

By enabling a dramatic decrease in the overall device thickness, graphene-based microfluidic devices disclosed herein enable the adaption of microfluidic crystallization platforms to crystallography. The present invention entails incorporation of one or multiple graphene layers into ultra-thin microfluidic devices, which architecture allows for a total material thickness of ~1 µm, facilitating on-chip X-ray diffraction analysis while creating a sample environment that is stable against significant water loss over several weeks. It is noted that the device thickness is dependent on the thickness of the supporting layer (PMMA), which in certain embodiments of the invention may be absent, resulting in a device for which the path-length through any obscuring material is atomically thin.

Excellent signal-to-noise was demonstrated in X-ray diffraction measurements using a 1.5 µs polychromatic X-ray exposure, which validates the approach via on-chip structure determination using hen egg white lysozyme (HEWL) as a model system.

The generation of a large number of high quality, isomorphous micro-crystals is an area where integrated microfluidic technologies excel. The small length-scales of microfluidic devices create an environment free of inertial or convective effects while providing exquisite control over local conditions and gradients. The reproducibility of the microfluidic environment allows for the formulation of identical crystallization conditions, without the uncontrolled variations in concentration that result from chaotic mixing in bulk crystallization strategies. The absence of these effects facilitates both the simultaneous growth of a large number of isomorphous crystals and can provide additional benefits in crystal quality.

The benefits of microfluidic crystallization strategies are enhanced when coupled with on-chip diffraction analysis. By leaving crystals undisturbed in a sealed environment, on-chip analysis avoids both challenges associated with harvesting a large number of tiny crystals from a microfluidic device and avoids the potential for crystal damage due to physical handling and/or exposure to the ambient environment. This approach also facilitates high levels of sample utilization by avoiding losses due to sample transfer or low hit-rates associated with continuous sample injection strategies. Unfortunately, the presence of the microfluidic device inherently introduces additional material into the X-ray path, resulting in signal attenuation and adversely affecting subsequent diffraction analysis.

Traditional microfluidic devices have been constructed out of millimeter-thick layers of glass, plastic, and/or poly(dimethylsiloxane) (PDMS). The thickness of such materials does not permit the effective transmission of X-rays (FIG. 1). Recently reported microfluidic designs have focused on decreasing the thickness of device materials along the X-ray path to ~100 µm. Despite these successes, microfluidic platforms for protein crystallography have typically been limited to data collection from relatively large crystals. The development of even thinner devices has suffered from either intensive manufacturing requirements, or challenges related to sample stability and water loss. Many of the fixed-target approaches for serial crystallography cannot be manufactured with the same ease and low cost as soft lithographic and replica molding-based approaches, and are not amenable to the use of more easily-manufacturable ultra-thin polymer films because of challenges related to water loss and sample dehydration over time.

The present invention provides for the straightforward incorporation of one or multiple single-layer graphene into ultra-thin microfluidic devices to enable in situ analysis of crystals in a sample environment that is stable against evaporation for weeks. To the best of our knowledge, this is the first time of the incorporation of large-sheet graphene into a microfluidic device to serve as a diffusion barrier against water loss.

The devices of the invention have been shown to enjoy long-term stability by quantifying the rate of water loss through the graphene-based thin films. Also demonstrated is the utility of graphene-based thin film microfluidics for on-chip X-ray crystallography by comparing the levels of signal-to-noise obtainable for diffraction signals as a function of device thickness. The invention is suitable for use in a wide range of lab-on-a-chip applications.

Thus, in one aspect, the invention generally relates to a microfluidic device. The microfluidic device includes: a top layer comprising a top support layer and one or more layer(s) of graphene, a bottom layer comprising a bottom support layer and one or more bottom layer(s) of graphene, and a middle layer sandwiched between the top layer and the bottom layer having a patterned cavity defining a sample holding chamber. The top layer exhibits an optically clear top window area comprising at least a portion of the top layer(s) of graphene. The bottom layer exhibits an optically clear bottom window area comprising at least a portion of the bottom layer(s) of graphene.

In certain embodiments, the one or more top layer(s) of graphene comprise from 1 to about 10 layers (e.g., 1, 2, 3, 4, 5, 6, 7, 8, 9, 10) of graphene. In certain embodiments, the one or more bottom layer(s) of graphene comprise from 1 to about 10 layers (e.g., 1, 2, 3, 4, 5, 6, 7, 8, 9, 10) of graphene.

In certain embodiments, the microfluidic device further includes: an inlet port in fluidic communication with the sample holding chamber; and an outlet port in fluidic communication with the sample holding chamber.

In certain embodiments, the top support layer comprises a material selected from, for example, polyester, cyclic olefin copolymer, polycarbonate, acrylic, other thermal-plastics, polytetrafluoroethylene (PTFE), PDMS, epoxy-based polymer films including SU-8 photoresist, Norland optical adhesive, mylar, glass, silicon, and silicon nitride.

In certain embodiments, the bottom support layer comprises a material selected from, for example, polyester, cyclic olefin copolymer, polycarbonate, acrylic, other thermal-plastics, PTFE, PDMS, epoxy-based polymer films including SU-8 photoresist, Norland optical adhesive, mylar, glass, silicon, and silicon nitride.

In preferred certain embodiments, each of the top support layer and the bottom support layer is made from polyester or cyclic olefin copolymer (COC), or a combination thereof.

In certain embodiments, each of the top and bottom layers of graphene is coated with a material selected from poly(methylmethacrylate) (PMMA) or other films resistant to exposure to ferric chloride.

In preferred certain embodiments, each of the top and bottom layers of graphene is coated with poly(methylmethacrylate) (PMMA).

In certain embodiments, the coated first and second graphene films are treated with a hydrophilic material selected from, for example, poly(dopamine), poly(ethylene glycol), polymer zwitterions, polymer brushes, or self-assembled monolayers.

In certain embodiments, the middle layer of the microfluidic device comprises a material selected from, for example, cyclic olefin copolymer, polyester, polycarbonate, PTFE, glass, silicon, silicon nitride.

In certain embodiments, the middle layer of the microfluidic device is made from cyclic olefin copolymer (COC).

In certain embodiments, the top layer and the middle layer is joined together by an adhesive layer positioned therebetween comprising a material selected from, for example, acrylic adhesive, UV-curing adhesive, and an epoxy-based adhesive.

In certain embodiments, the bottom layer and the middle layer is joined together by an adhesive layer positioned therebetween comprising a material selected from acrylic adhesive, UV-curing adhesive, and an epoxy-based adhesive.

In certain embodiments, any two layers may be bound together using thermal bonding, solvent bonding of polymer films, surface silanization, and/or other surface treatment techniques.

The sample holding chamber may be designed to have any suitable volume and dimensions. In certain embodiments, the sample holding chamber is from about 10 nL to about 10 µL (e.g., from about 10 nL to about 5 µL from about 10 nL to about 1 µL, from about 10 nL to about 500 nL, from about 10 nL to about 100 nL, from about 10 nL to about 50 nL, from about 50 nL to about 10 from about 100 nL to about 10 µL, from about 500 nL to about 10 µL, from about 1 µL to about 10 µL, from about 10 nL to about 10 µL, from about 100 nL to about 1 µL, from about 500 nL to about 5 µL) in volume.

In certain embodiments, the sample holding chamber has an overall thickness from about 10 µm to about 1 mm (e.g., from about 10 µm to about 500 µm, from about 10 µm to about 100 µm, from about 10 µm to about 50 µm, from about 50 µm to about 1 mm, from about 100 µm to about 1 mm, from about 500 µm to about 1 mm, from about 50 µm to about 500 µm, from about 100 µm to about 500 µm).

In certain embodiments, each of the top and bottom windows is from about 100 µm$^2$ to about 1 cm$^2$ (e.g., from about 400 µm$^2$ to about 1 cm$^2$, from about 900 µm$^2$ to about 1 cm$^2$, from about 2,500 µm$^2$ to about 1 cm$^2$, from about 10,000 µm$^2$ to about 1 cm$^2$, from about 1 mm$^2$ to about 1 cm$^2$, from about 9 mm$^2$ to about 1 cm$^2$, from about 25 mm$^2$ to about 1 cm$^2$, about 10 mm$^2$ in size, from about 10 mm$^2$ to about 50 mm$^2$ in size, from about 50 mm$^2$ to about 1 cm$^2$ in size).

In certain embodiments, each of the top and bottom layers of graphene is a graphene film comprising one or more graphene layers having a size from about 1 mm$^2$ to about 60 cm$^2$ (e.g., from about 2 mm$^2$ to about 60 cm$^2$, from about 10 mm$^2$ to about 60 cm$^2$, from about 1 cm$^2$ to about 60 cm$^2$, from about 10 cm$^2$ to about 60 cm$^2$, from about 1 mm$^2$ to about 10 cm$^2$, from about 1 mm$^2$ to about 5 cm$^2$, from about 1 mm$^2$ to about 1 cm$^2$, from about 1 mm$^2$ to about 50 mm$^2$, from about 1 mm$^2$ to about 20 mm$^2$, from about 5 mm$^2$ to about 1 cm$^2$, from about 10 mm$^2$ to about 1 cm$^2$).

The devices of the invention are designed to maintain a desired environment for samples under analysis. In certain embodiments, one or more layer(s) of graphene in the device serve as a vapor diffusion barrier(s). In certain embodiments, one or more layer(s) of graphene in the device serve as a diffusion barrier(s) to water vapor. In certain embodiments, one or more layer(s) of graphene in the device serve as a diffusion barrier(s) to oxygen. In certain embodiments, one or more layer(s) of graphene in the device serve as a diffusion barrier(s) to both water vapor and oxygen.

In another aspect, the invention generally relates to an array device (or device array or network) having two or more microfluidic devices according to the invention.

In certain embodiments, the array device includes from about 2 to about 1,536 of (e.g., from about 2 to about 960, from about 2 to about 768, from about 2 to about 576, from about 2 to about 384, from about 2 to about 96) the microfluidic devices disclosed herein.

In another aspect, the invention generally relates to a method for fabricating a microfluidic device. The method includes: providing a first graphene film comprising one or more layer(s) of graphene and a second graphene film comprising one or more layer(s) of graphene; coating the first graphene film and the second graphene film with a layer of a material resistant to exposure to ferric chloride; transferring the coated first graphene film to a support layer forming a top layer with a window area defined by the first graphene film; transferring the coated second graphene film to a support layer forming a bottom layer with a window area defined by the second graphene film; providing a middle layer exhibiting a defined pattern (e.g., a cut-out, 3D printed, or lithographically-defined pattern); and forming the microfluidic device by bonding the middle layer to and between the top and the bottom layers to form a sandwiched construct having a cavity defined by the top and bottom layers and the pattern of the middle layer.

In certain embodiments, the pattern of the middle layer is provided via a cutout, 3D printing, or lithography.

The graphene film may be made by any suitable method. In certain embodiments, the graphene film is grown on a copper substrate by chemical vapor deposition. In certain embodiments, the graphene film is grown by chemical vapor deposition.

In certain embodiments, the graphene film is released from the copper substrate by etching.

Transferring the coated first graphene film to a support layer may be done by any suitable technique, for example, by floating the graphene film on a water surface.

In certain embodiments, the method further includes, before the step of graphene transfer, treating the graphene films with a hydrophilic material, for example, poly(dopamine).

In yet another aspect, the invention generally relates to a method of X-ray diffraction. The method includes: growing one or more microcrystals in the sample chamber of a microfluidic device disclosed herein; directing an X-ray beam to the one or more microcrystals via the top or bottom window of the microfluidic device; and measuring the X-ray diffraction of the one or more microcrystals via the bottom or top window of the microfluidic device.

In certain embodiment, the steps of directing an X-ray beam and measuring the X-ray diffraction are repeated.

Any suitable materials maybe analyzed by the method disclosed herein. Biological materials such as proteins, or materials of non-biological origin, may be crystallized and analyzed by the X-ray diffraction or micro crystallography method disclosed herein.

Exemplary proteins or polypeptides include both soluble and membrane proteins. Other biological materials include nucleic acids (e.g., DNA and RNA), polysaccharides as well as small molecules.

In certain embodiments, the microcrystals are that of a small molecule organic compound. In certain embodiments, the microcrystals are that of an inorganic compound. In certain embodiments, the microcrystals are that of a synthetic polymer.

In yet another aspect, the invention generally relates to a method of X-ray scattering or diffraction. The method includes: providing one or more crystalline or non-crystalline materials in the sample chamber of a microfluidic device disclosed herein; directing an X-ray beam to the one or more crystalline or non-crystalline materials via the top or bottom window of the microfluidic device; and measuring the X-ray scattering or diffraction of the one or more crystalline or non-crystalline materials via the bottom or top window of the microfluidic device.

In certain embodiments, the method is for X-ray scattering. In certain embodiments, the method is for X-ray diffraction.

In certain embodiments, the steps of directing an X-ray beam and measuring the X-ray scattering or diffraction are repeated.

Any suitable materials maybe analyzed by the method disclosed herein. In certain embodiments, the crystalline or non-crystalline materials are of a biological material. In certain embodiments, the crystalline or non-crystalline materials are of a non-biological origin.

In certain embodiments, the crystalline or non-crystalline materials are of an organic compound. In certain embodiments, the crystalline or non-crystalline materials are of an inorganic compound. In certain embodiments, the crystalline or non-crystalline materials are of a synthetic polymer.

In certain embodiments, the crystalline or non-crystalline materials are in the form of a solution or a mixture. In certain embodiments, the crystalline or non-crystalline materials are solutions or mixtures of proteins, polymers, micelles and/or nanoparticles.

In certain embodiments, the X-ray scattering or diffraction is measured via small-angle X-ray scattering or diffraction. In certain embodiments, the X-ray scattering or diffraction is measured via wide-angle X-ray scattering or diffraction.

In certain preferred embodiments, the steps of directing an X-ray beam and measuring the X-ray diffraction or scattering are repeated, for example, 2, 3, 4, 5, 6, to as many time as needed.

In yet another aspect, the invention generally relates to a method for introduction of a sample into the microfluidic sample chamber for subsequent X-ray analysis (e.g., diffraction, scattering).

The methods of the invention are suitable to analyze samples that are sensitive to certain environmental conditions, such as the presence of oxygen. In certain embodiments, the crystalline or non-crystalline sample being analyzed is sensitive to or reactive with oxygen, for example, metalloproteins or CO- or Xe-treated proteins.

In a preferred embodiment, the microfluidic platform of the invention allows serial crystallography of micro-crystals (<10 μm in size) for de novo structure determination, time-resolved crystallography, and continuous diffraction/diffuse scattering experiments where the ability to detect small variations in the overall X-ray signal is critical. To achieve the low levels of background noise and high signal transmission necessary for these applications, design criteria were established for the X-ray transparent microfluidic device. Three main aspects of the interaction of device materials with X-rays were studied: (i) attenuation of the X-ray signal, (ii) background noise resulting from the interaction of the device materials with the X-ray beam, and (iii) the strength of the diffraction resulting from a crystal.

Examples

Figure 9A:
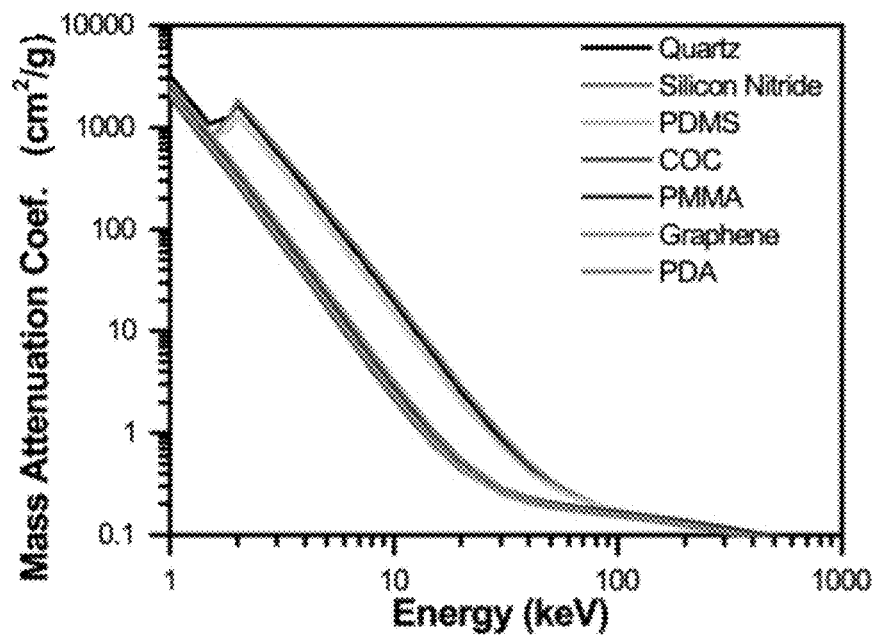
FIG. 9A-9B. Linear attenuation coefficients μ for quartz, silicon nitride, PDMS, COC, PMMA, graphene, and PDA as a function of X-ray FIG. 9A energy or FIG. 9B wavelength.
Figure 9B:
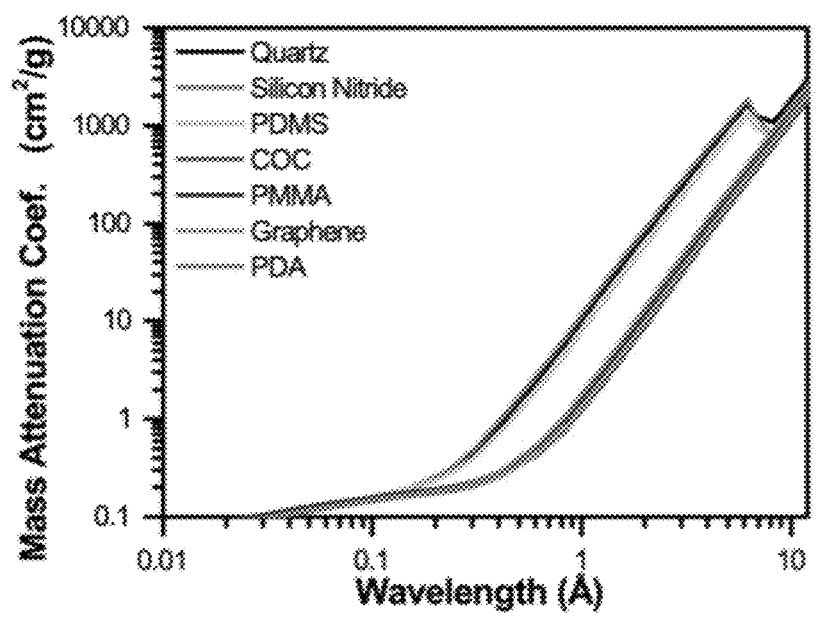

Attenuation, or the change in intensity of the X-ray beam can be calculated for any material based on the atomic weight of the atoms present, the density of the material, and the wavelength of interest (see Table 2 and FIG. 9A-FIG. 9B). Attenuation effects can be minimized by decreasing the atomic weight of the atoms present in the material, decreasing the density, and/or decreasing the thickness. Based on these calculations, it was shown that at a wavelength of 1 Å (12.4 keV), achieving transmission levels of 99% would necessitate decreasing the thickness of the device to only 1 μm of PDMS, or approximately 10 μm of an organic polymer such as cyclic olefin copolymer (COC) or poly (methylmethacrylate) (PMMA). Achieving 99.9% transmission would require 200 nm-thick PDMS, or approximately 900 nm thick COC or PMMA (FIG. 1 and FIG. 10A-FIG. 10F). However, most sub-micron polymeric films suffer from relatively high rates of water permeation. A strategy was developed for coupling sub-micron polymer films with large-area, single-layer sheets of graphene to create a diffusion barrier against water loss.

TABLE 1

Crystallographic statistics for data obtained using on-chip micro-diffraction Laue analysis of various HEWL crystals

| Parameter | Microbatch | | Counter-Diffusion |
|---|---|---|---|
| | PMMA/Graph. | +COC Film | PMMA/Graph. |
| Data Collection | | | |
| Total # Frames | 55 | 59 | 30 |
| # Frames/Spot | 3 | 4 | 3 |
| Resolution (Å) | 50-1.40 | 50-1.41 | 50-1.46 |
| Space Group | $P4_32_12$ | $P4_32_12$ | $P4_32_12$ |
| Unit Cell (Å) | a = b = 79.1, c = 37.7 | a = b = 79.1, c = 37.3 | a = b = 79.1, c = 37.8 |
| Single Reflections | | | |
| Total Obs. | 150,678 | 143,638 | 70,996 |
| Unique Obs. | 18,294 | 17,608 | 15,629 |
| Redundancy | 8.2 | 8.2 | 4.5 |
| $R_{merge}$ on $F^2$ | 0.054 | 0.077 | 0.047 |
| $R_{merge}$ on F | 0.036 | 0.049 | 0.031 |
| $<F/\sigma(F)>$ | 63.9 (28.6) | 50.7 (19.9) | 60.4 (33.4) |
| Single and Multiple Reflections Combined | | | |
| Completeness (%) | 77.2 (25.1) | 76.6 (28.4) | 74.8 (27.1) |
| Structure Refinement | | | |
| $R_{work}$ | 0.149 | 0.156 | 0.145 |
| $R_{free}$ | 0.163 | 0.176 | 0.167 |
| Ramachandran Statistics | | | |
| Favored | 123 (96.9%) | 122 (96.1%) | 122 (96.1%) |
| Allowed | 4 (3.1%) | 5 (3.9%) | 5 (3.9%) |
| Disallowed | 0 (0.0%) | 0 (0.0%) | 0 (0.0%) |

† Values in parentheses are for the highest integrated resolution shell.

To facilitate incorporation of a sub-micron polymer film to serve as an impermeable X-ray window, single-layer graphene was coated with a ~500 nm-thick layer of PMMA and transferred to pre-cut adhesive polyester substrates having the appropriate features to define a window and/or inlet structures for the top and bottom of the device (FIG. 2A-FIG. 2D and FIG. 16A-FIG. 16D). The presence of the adhesive helped to secure both the PMMA/graphene films in place, as well as adhering these top and bottom layers to a spacer layer of 100 μm-thick COC, pre-cut to define the microfluidic features of the device. This strategy took advantage of commercially available materials and avoided the need to apply a separate adhesive treatment that would potentially increase the overall thickness of the device. This strategy can be adapted to work with a variety of alternative strategies for defining microfluidic channels, including roll-to-roll manufacturing.

Figure 3A:
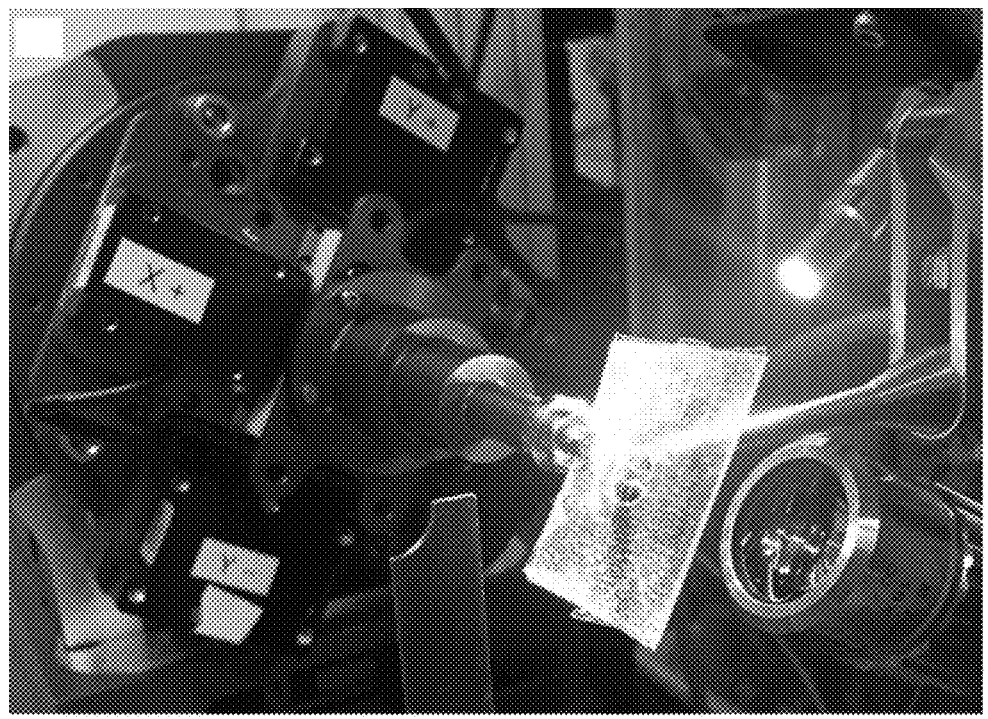
FIG. 3A A microbatch chip mounted on the 14-ID-B beamline at BioCARS, oriented at −30° towards the high-resolution camera.
Figure 3B:
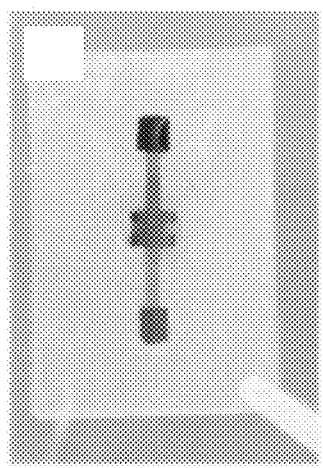
FIG. 3B Photograph of a counter-diffusion chip that has been filled with blue and red food dye to simulate on-chip mixing. Optical micrographs under crossed-polarizers showing HEWL crystals grown in a FIG. 3C microbatch and FIG. 3D counter-diffusion chip. Crystals from 50-500 μm formed overnight. The inset shows a close-up view of selected crystals.
Figure 3C:
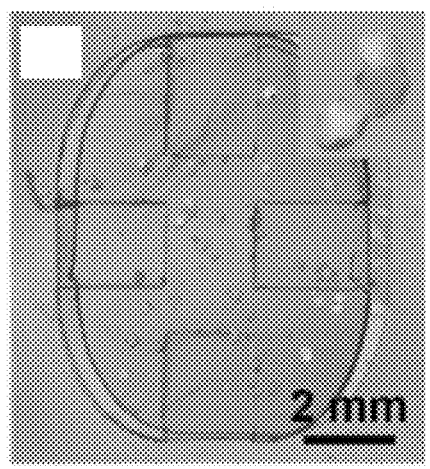
Figure 3D:
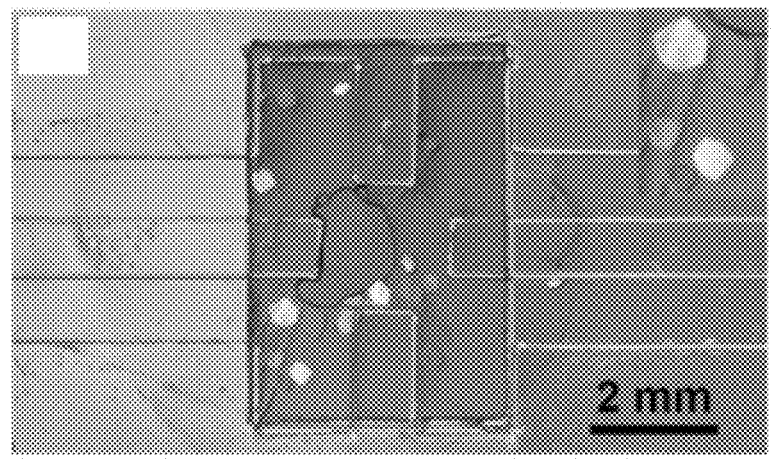
Figure 4:
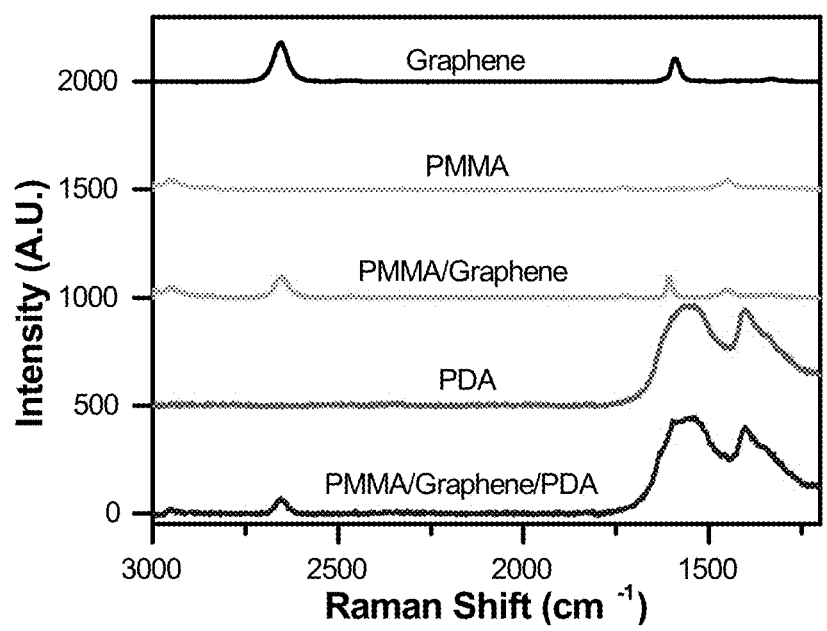
FIG. 4. Raman spectra, demonstrating the expected signals for graphene, 500 nm PMMA, and PDA separately, and in the final composite films.
Figure 19A:
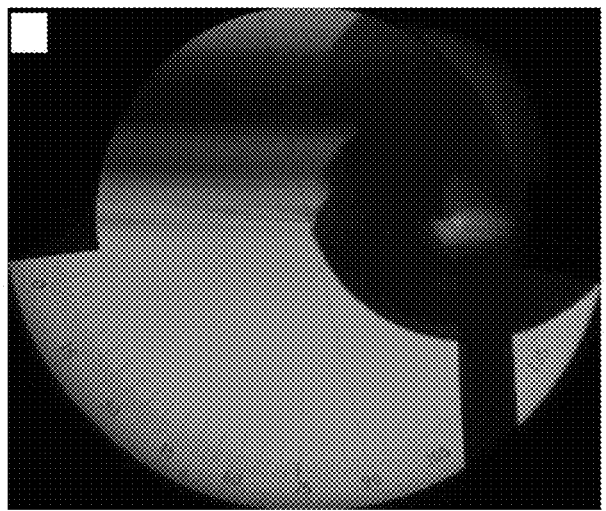
FIG. 19A-FIG. 19B. Optical micrographs of contact angle measurements for FIG. 19A an untreated 500 nm PMMA on graphene, and FIG. 19B 500 nm PMMA/graphene, following a 5 hour PDA treatment.
Figure 19B:
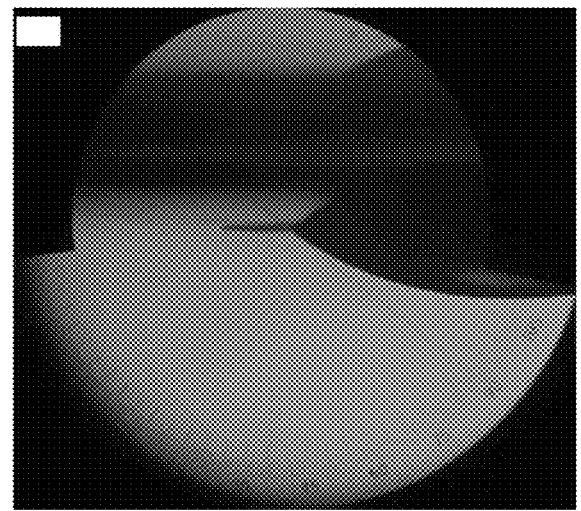

This manufacturing strategy was used to develop simple microfluidic geometries to enable microbatch and counter-diffusion crystallization experiments (FIG. 2A-FIG. 2D and FIG. 3A-FIG. 3D). However, the various polymeric surfaces present in the device proved to be relatively hydrophobic, such that the crystallization solutions would not easily wet and flow into a microfluidic channel. This difficulty was overcome through the application of an ultra-thin, hydrophilic, poly(dopamine) (PDA)-based surface treatment. A solution of dopamine at pH 8.5 was allowed to incubate on the various surfaces of the microfluidic channel (FIG. 2A-FIG. 2D and FIG. 16A-FIG. 16D). Under basic conditions, dopamine has been shown to polymerize and create a ~10 nm-thick hydrophilic surface coating. Contact angle measurements showed a change in wetting angle from 74° before treatment, to 36° after treatment (FIG. 19A-FIG. 19B). Further confirmed was the presence of both PDA and the integrity of the graphene film via Raman spectroscopy (FIG. 4). This level of wetting proved to be sufficient for aqueous solutions to easily wet and flow into the device (FIG. 3B).

Figure 14A:
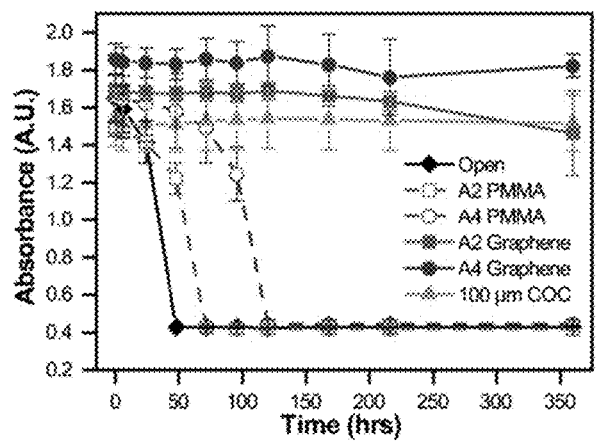
FIG. 14A Measurement of the absorbance of colored solutions as a function of time at 300 nm, demonstrating the water permeability of various PMMA, PMMA/graphene, and COC films. Both the thicker 100 μm COC film, and the two PMMA/graphene films show no significant decrease in signal over the course of more than two weeks.
Figure 14B:
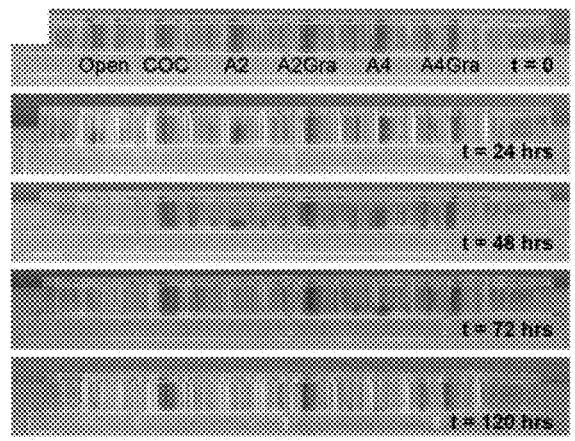
FIG. 14B Photographs of the experimental setup showing changes in the liquid levels as seen by a side-view. Perspective FIG. 14C and top-view FIG. 14D images of the well plate after 72 hours, showing the complete evaporation of water from both the open and the A2 PMMA (~180 nm) wells, and the partial evaporation of water from the A4 well (~500 nm).
Figure 14C:
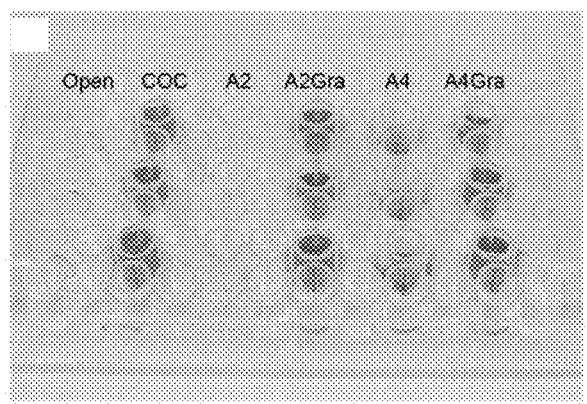
In FIG. 14D, the iridescent sheen of the graphene film can be seen on both the A2Gra and A4Gra wells.
Figure 14D:
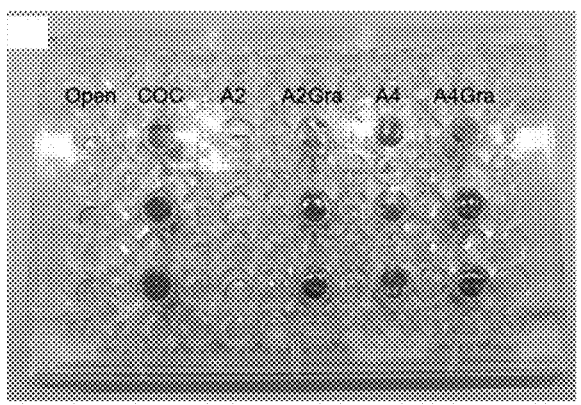

Graphene was incorporated into the microfluidic device architecture to create a diffusion barrier to minimize the loss of water from the device. The effectiveness of various polymeric films was tested on preventing the evaporative loss of water in a well plate-style assay. Both visual inspections of the various wells (FIG. 5A and FIG. 14A-FIG. 14D) and quantitative analysis via absorbance measurements at 300 nm (FIG. 14A) and 450 nm (FIG. 5B) demonstrated the efficacy of single layer of graphene as a diffusion barrier against water loss.

Under the experimental conditions, complete evaporation of an open well occurred over the course of approximately 48 hours, while the presence of a 180 nm-thick A2 PMMA film only extended this lifetime to 72 hours. However, the addition of a single layer of graphene decreased the rate of water loss such that only minimal water loss was observed after 360 hours (15 days).

Similarly, a 500 nm-thick A4 PMMA film showed complete evaporation after 120 hours, but the addition of graphene resulted in negligible water loss over the entire course of the experiment. These graphene-based, sub-micron films provided the same level of protection against water loss as a 100 μm-thick film of COC, a material known for its low water permeability. (Nunes, et al. *Microfluid. Nanofluid.*, 2010, 9, 145-161.) Multiple layers of graphene may also be used to further improve the barrier properties of the film.

Figure 15A:
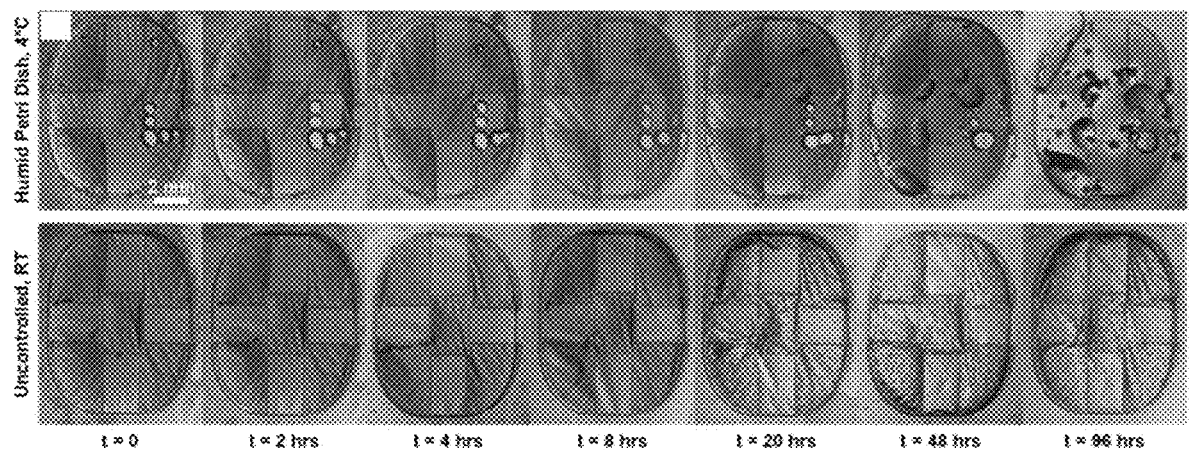
FIG. 15A-FIG. 15B. Optical micrographs showing the change in solution content within FIG. 15A microbatch and FIG. 15B counter-diffusion style microfluidic devices as a function of time. Devices were stored either in a sealed petri dish along with 200 μL of water at 4° C. to create a hydrated environment, or under ambient laboratory conditions at room temperature. The filling solution consists of a lysozyme crystallization trial colored with red food coloring for improved visualization. For the devices stored in a humidified environment, droplets of condensation can be observed on the device, along with the formation of red-colored lysozyme crystals. In the microbatch experiment in FIG. 15A, no significant changes in solution content were observed over the course of the experiment, regardless of incubation conditions. Similar results were obtained in FIG. 15B for the counter-diffusion chip stored in a humidified environment. However, significant water loss was observed over the course of 8 hours for the counter-diffusion chip incubated at ambient conditions due to evaporative losses from the portions of the channel not protected by the graphene film.
Figure 15B:
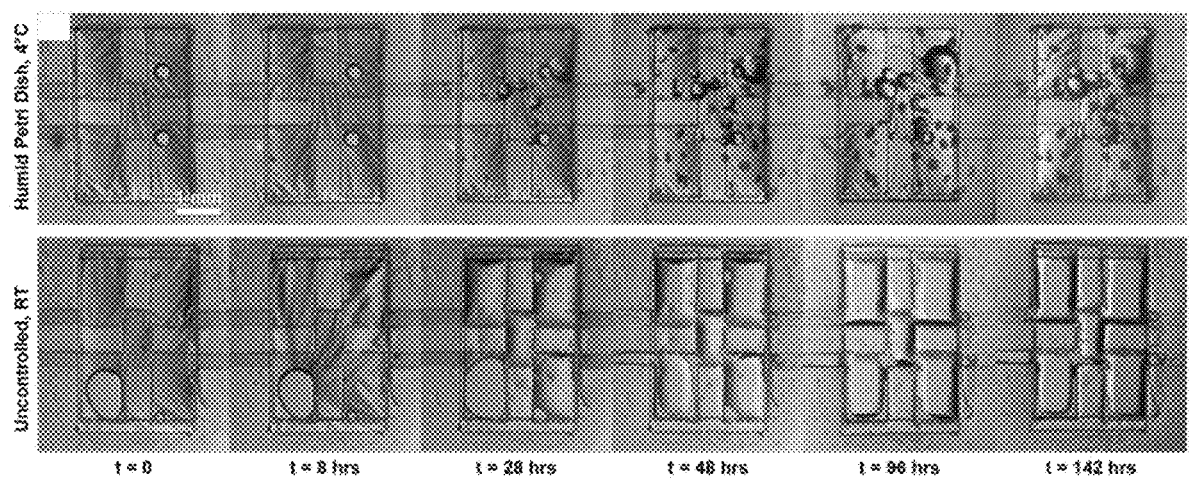
Figure 16A:
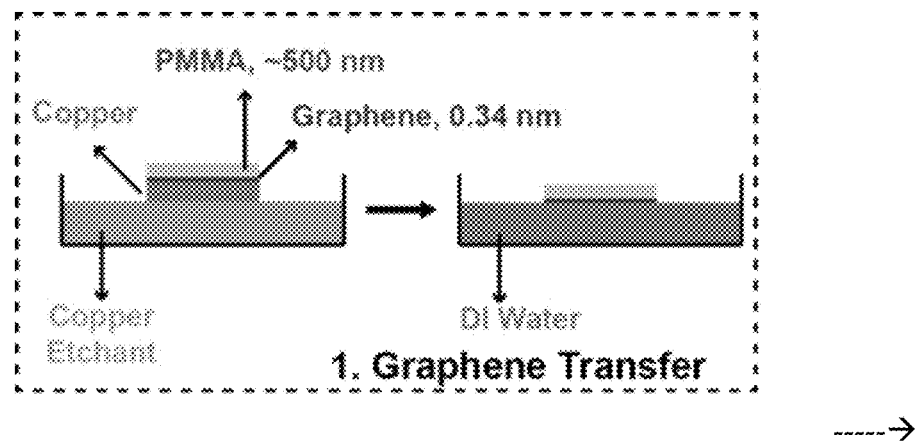
FIG. 16A-FIG. 16D. Schematic depiction of the fabrication scheme for thin-film, microbatch-style, graphene-based microfluidics.
Figure 16B:
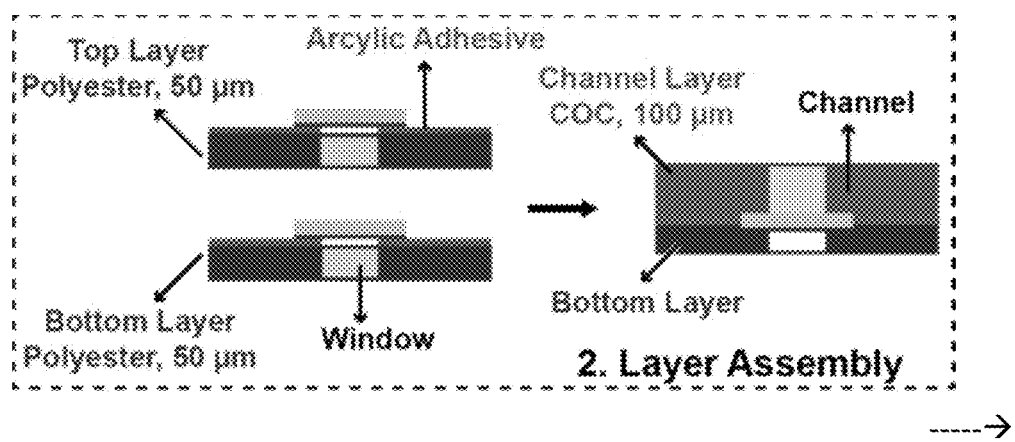
Figure 16C:
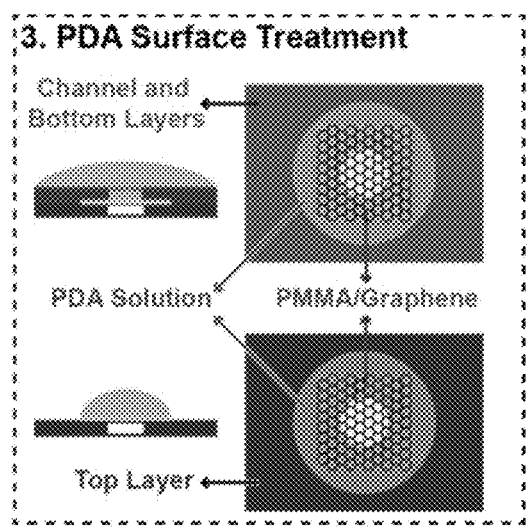
Figure 16D:
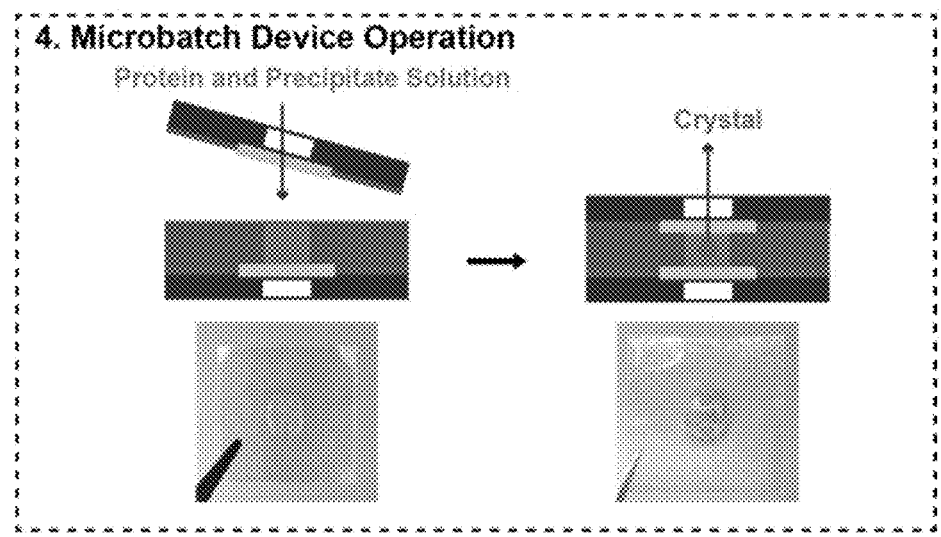
Figure 17A:
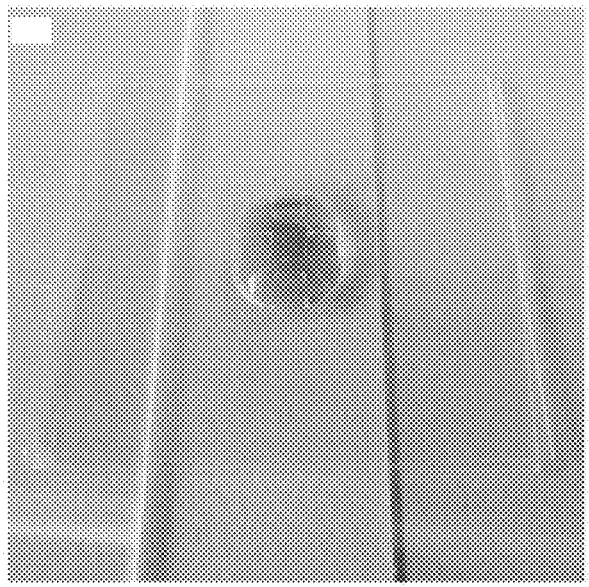
FIG. 17A-FIG. 17D. Photographs of FIG. 17A a microbatch chip undergoing PDA treatment, FIG. 17B the final, assembled device, FIG. 17C a counter-diffusion style chip undergoing PDA treatment, and FIG. 17D the final device.
Figure 17B:
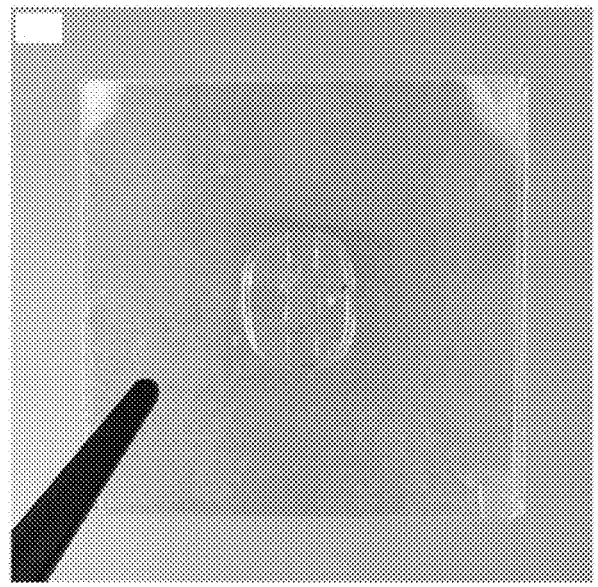
Figure 17C:
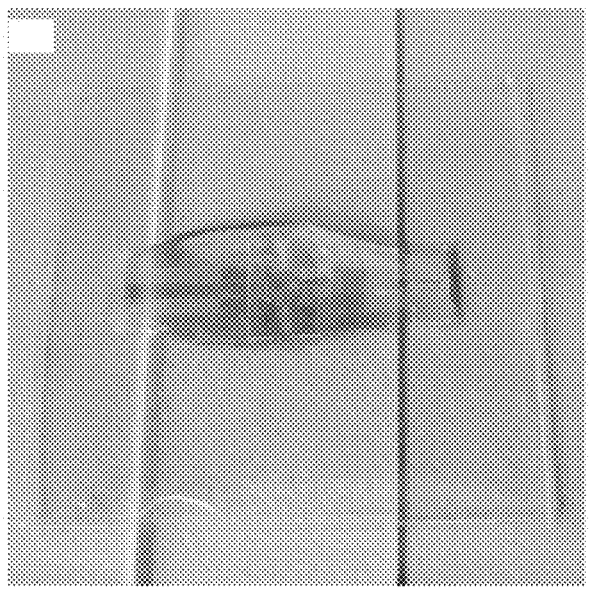
Figure 17D:
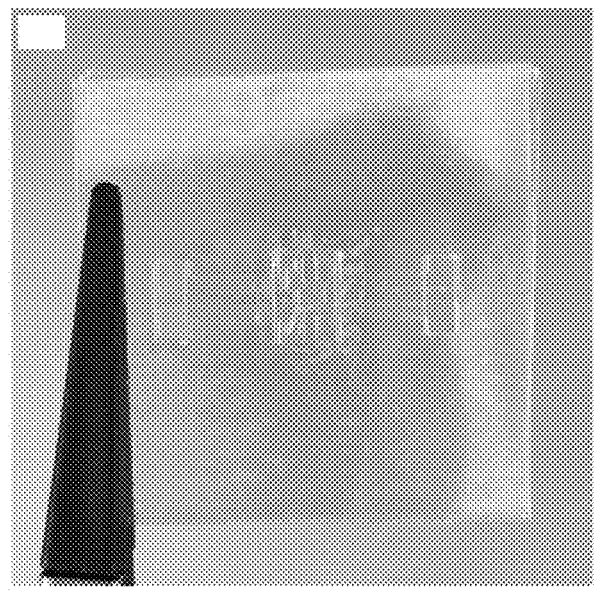

Water permeation experiments using a fully assembled microfluidic device architecture further demonstrated the effectiveness of the platform. Visual inspection of optical micrographs indicated no significant water loss over the course of 96 hours (4 days) for microbatch devices where the sample chamber was completely enclosed between two gas impermeable PMMA/graphene films (FIG. 15A). For the case of the counter-diffusion chip, if only the main sample chamber was protected by PMMA/graphene films, then significant water loss was observed from the unprotected areas of the device over the course of ~1 day (FIG. 15B). Such evaporative losses can be mitigated by sample incubation in a controlled humidity environment or by device designs that incorporate complete isolation of the sample environment within a graphene film.

Having demonstrated the efficacy of the device materials to protect against dehydration and enable long-term sample incubation, microbatch and counter-diffusion crystallization trials were set up using HEWL. Large crystals (>100 μm, FIG. 3C, FIG. 3D) formed overnight for both of these methods, and were stable in the lab for days at 4° C. As a precaution, devices were placed into a petri dish along with a reservoir of water and sealed. These samples easily survived the rigors associated with overnight shipping to the synchrotron. This demonstration of stability significantly enhances the utility of these devices by allowing users to prepare crystallization trials at their home laboratory, incubate as needed, and transport their samples for analysis with the same relative ease as with more traditional samples.

The levels of signal-to-noise achievable for on-chip X-ray diffraction measurements were investigated. While attenuation calculations (FIG. 1 and FIG. 10A-FIG. 10F) describe the total signal lost via transmission through a material, this does not characterize the observed signal-to-noise. The level of background scatter was investigated for the various device materials as a function of resolution. The introduction of a thin A2 PMMA film resulted in an approximately 10-fold increase in the observed background scattering, compared to air only (FIG. 11A-FIG. 11D). No significant change in signal was observed with the subsequent addition of either graphene or a PDA treatment, and a minimal increase in scattering was observed when the PMMA film was increased from 180 nm-thick A2, to 500 nm-thick A4 PMMA. However, a further increase in scattering was observed with the addition of a 100 μm-thick film of COC. The signal for COC showed increases in the overall levels of background noise, with resolution-dependent scattering bands present at approximately 2.5 Å and 5 Å, characteristic of the internal structure of the polymer. It should be noted that Laue diffraction, due to the polychromatic nature of the X-ray beam, typically suffers from higher background and thus poorer signal-to-noise than monochromatic X-ray diffraction methods. Consequently, the experiments performed here are a powerful demonstration of the utility of the disclosed invention.

While basic characterization of the background scattering for the device materials was performed with the sample mounted perpendicular to the incident X-ray beam, protein structure determination can require sample rotation to enable data collection from a variety of different crystal orientations. Thus, considerations must include not only the thickness of the device materials in terms of a minimal path length, but based on sample orientation. The relative path length through a film as a function of rotation angle was calculated (FIG. 12A-FIG. 12D). This path length can be approximated simply as $1/\cos(\phi)$, and diverges as the angle $\phi$ approaches 90°. However, because of low signal attenuation, a transmission of 99.9% of the incident signal through a rotation of +/−86° from normal was maintained. This large range of rotation means that for low-symmetry space-group crystals, or for anomalous diffraction measurements, the devices are able to access 344° out of a possible 360° rotation at a better than 99.9% level. If the level of acceptable signal attenuation is deceased to 90% of the incident beam intensity, +/−89.5° of rotation from normal can be achieved, meaning that only 2° of data would be out of reach. These high levels of transmission and the ability to access a wide range of sample orientations are a dramatic improvement over previously-reported PDMS/COC based devices which enable a maximum of only 77% of the incident X-ray intensity when normal to the incident beam.

Next investigated was the effect of this background scattering on the signal-to-noise associated with on-chip X-ray diffraction measurements. All images were well exposed, typically with several saturated diffraction spots (~65,000 counts). A comparison of both the 2D diffraction images and the corresponding 1D integrations shows the presence of strong diffraction peaks and an additional diffuse signal around 3 Å, which is attributed to the presence of solvent (FIG. 6A-FIG. 6C and FIG. 13A-FIG. 13D). The observed strength of the diffraction signal decreases relative to the background noise at higher resolution, as expected. It should be noted that the data presented in FIG. 6A-FIG. 6C and FIG. 13A-FIG. 13D is the result of integration in 2θ across the entire image, rather than along a line. Thus, the presence of multiple diffraction peaks at nearly the same resolution could result in apparent broadening of the integrated signal.

The benefit of the ultra-thin device materials can be observed through a comparison of the observed signal-to-noise from a crystal analyzed in one of the PMMA/graphene-based microbatch devices, compared with a second crystal from the same device that opportunistically grew underneath the COC spacer layer. Comparing the data from these two crystals, clearly observable was a decrease in signal quality as a result of the higher background signal from the 100 μm-thick COC layer, both visually in the 2D diffraction images, and more quantitatively in the 1D integrations (FIG. 6A-FIG. 6C and FIG. 13A-FIG. 13D). Previously it had been difficult to observe diffraction for relatively small crystals in a PDMS/COC device, and posit that the balance of signal-to-noise observed here explains the observations.

Furthermore, complete datasets were collected for different individual crystals using a micro-focused X-ray beam to enable the collection of small wedges of data from distinct locations across a crystal. Not observed was a significant variation in data obtained from different crystals within the same device (microbatch), or between crystallization techniques (microbatch vs. counter-diffusion; Table 1 and Table 3). However, in general, the counter-diffusion method would be expected to result in more reproducible crystal growth, due to the precise control over concentration gradients, diffusion, and mixing afforded by microfluidic devices.

Data from the two microbatch-grown crystals described in FIG. 6A-FIG. 6C and FIG. 13A-FIG. 13D were compared to examine the effect of an obscuring 100 μm-thick COC layer. Interestingly, a significant decrease in resolution for the crystal present under the thicker COC film was not observed. This result may be due to the relatively strong diffraction signals expected from the large crystals. High quality crystallographic statistics were observed for all samples; however, the presence of the thick COC film did correspond with an increase in the values for $R_{merge}$, and a decrease in signal-to-noise (i.e., $<F/\sigma(F)>$).

Figure 7:
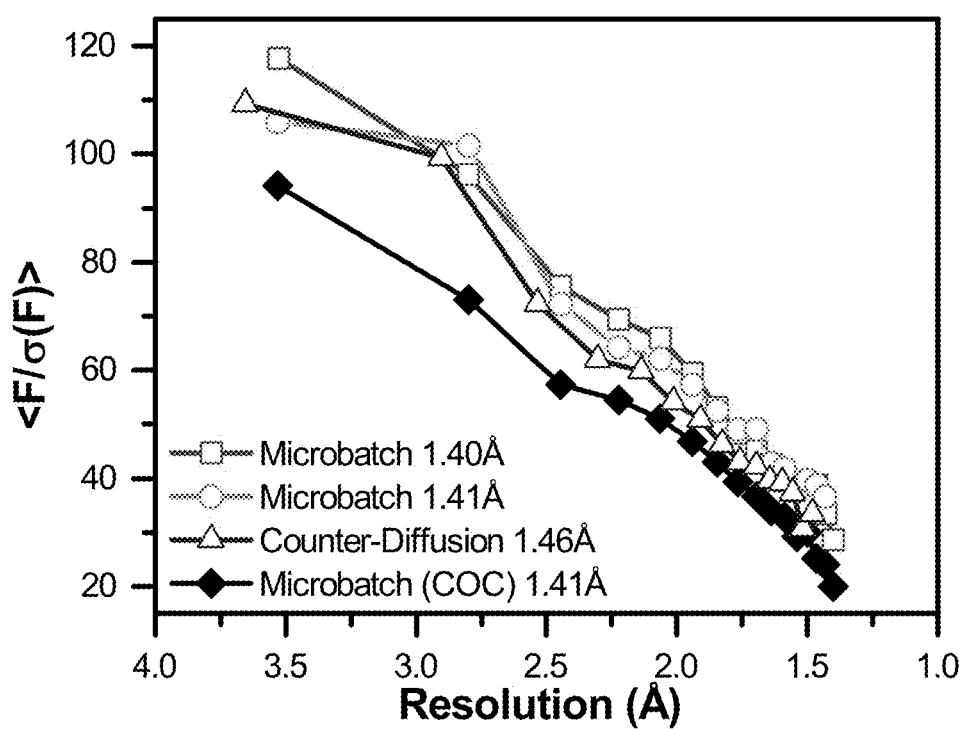
FIG. 7. Graph of signal-to-noise $<F/\sigma(F)>$ as a function of resolution for the four datasets shown in Table 3. The final resolution of the dataset is indicated in the legend. A significant decrease in $<F/\sigma(F)>$ is observed for the dataset collected in the presence of a 100 μm-thick COC film.
Figure 8:
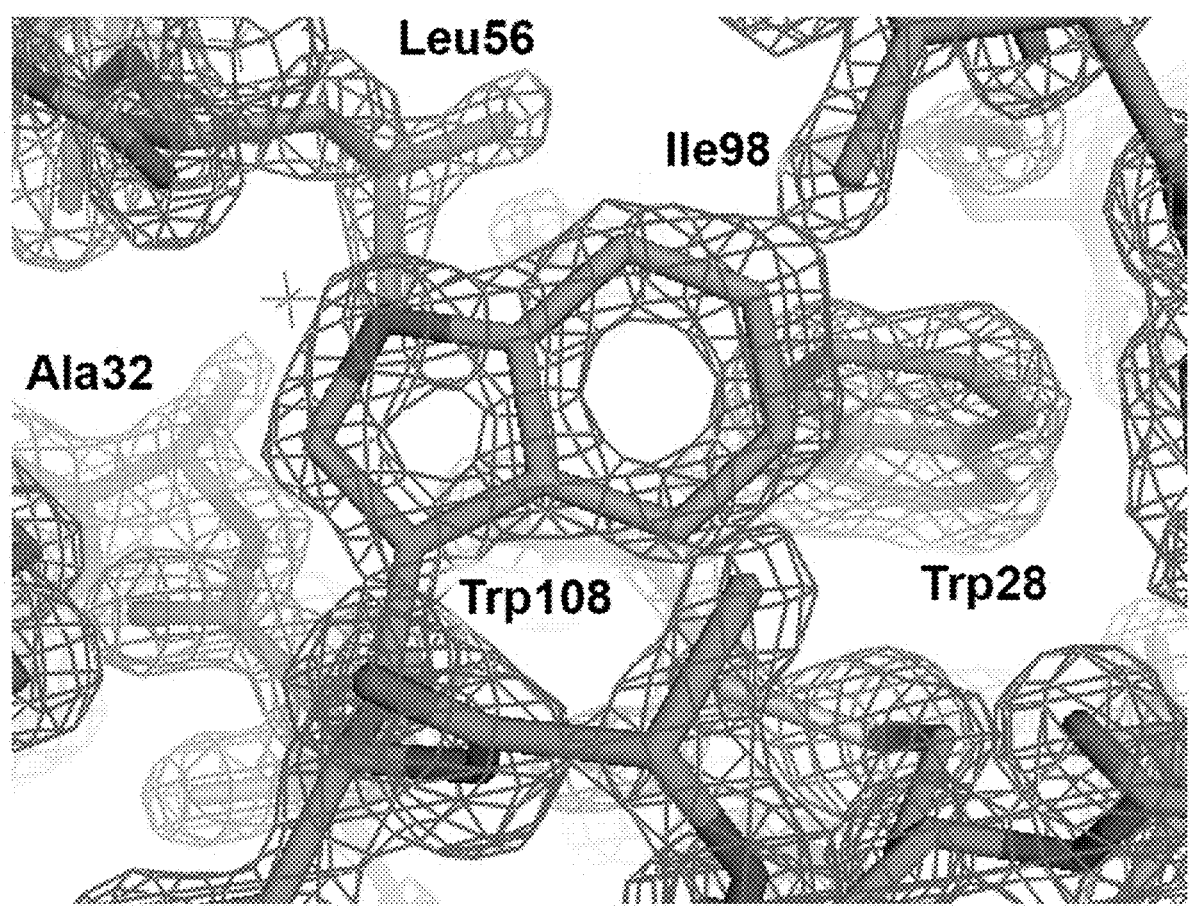
FIG. 8. $2F_o$-$F_c$ electron density map of HEWL grown in microbatch to 1.40 Å. The map was contoured at 2σ and superimposed over a licorice representation of the protein structure surrounding Trp108.

A closer analysis of $<F/\sigma(F)>$ as a function of resolution (FIG. 7) demonstrated that the increased attenuation and background scatter resulting from the presence of a 100 μm-thick COC layer had a negative effect on the overall sensitivity of the measurement. This decrease in signal-to-noise was observed despite similar, levels of completeness and redundancy in the overall dataset, compared with data collected through PMMA/graphene windows (Table 1, Table 3, and FIG. 20). The effect of background material on signal-to-noise can be particularly highlighted with respect to a significant decrease in $<F/\sigma(F)>$ at a resolution of ~2.5 Å, corresponding to one of the scattering bands observed for COC (FIG. 6A-FIG. 6C and FIG. 13A-FIG. 13D). Not directly observed was the impact of the larger scattering band observed at ~5.0 Å, due to the range of resolutions over which the binned $<F/\sigma(F)>$ data were provided by the processing software. However, contributions from this large scattering band may be what cause the large difference in $<F/\sigma(F)>$ at low resolution between the samples containing COC and those without.

Examination of the electron density maps generated from these various datasets show similar levels of structural detail, as would be expected from data extending to ~1.40 Å (FIG. 8 and FIG. 21A-FIG. 21C). The quality of the data allows for unambiguous interpretation of structural details, including side-chain conformations, the presence of aromatic groups, and the location of bound water molecules. Statistical measures associated with structure refinement ($R_{work}$, and $R_{free}$) were very good, and showed no significant dependence on the details of data collection.

It should be noted that the excellent levels of signal-to-noise obtained for all of these samples, as well as the informative differences between samples, and high levels of structural detail were observed based on the diffracted intensity produced by a 1.5 μs polychromatic X-ray exposure (11 consecutive X-ray pulses of 100 ps duration). The next phase of testing focuses on the serial analysis of micro-crystals. Investigation is also carried out regarding the potential for performing data collection using only a single ~100 ps X-ray pulse.

The ability to collect data from micro-crystals can enable structure determination from targets that have proven resistant to the growth of larger crystals for more traditional analyses. This approach takes advantage of microfluidics to grow a large number of high-quality, isomorphous crystals while facilitating efficient, high-throughput serial diffraction analysis without the need for sample handling and mounting. Additionally, these types of serial methods can be used to potentially "out-run" radiation damage by, coupling single-shot analysis of a large number of crystals with fast data collection. (Warkentin, et al. *Journal of Synchrotron Radiation*, 2013, 20, 7-13.) Strategies for implementing this type of approach include single X-ray pulse Laue diffraction at synchrotron sources, as well as more advanced, XFEL-based methods.

Experimental

Graphene Synthesis and Film Transfer

Monolayer graphene was grown on a copper substrate by chemical vapor deposition in a quartz tube furnace (Plana Tech). Solutions of 950PMMA A2 and 950PMMA A4 (poly(methylmethacrylate), Microchem) were spin coated (Specialty Coating Systems) onto the graphene film at 1000 rpm for 60 seconds, followed by curing at 120° C. for 10 minutes to form a PMMA film thickness of approximately 180 nm and 500 nm respectively, as measured by profilometry (Dektak 3). The PMMA/graphene film was released from the copper substrate by back-etching of the copper in an aqueous solution of copper etchant solution (Transene) for 3 hours, followed by three rinse cycles in MilliQ water (18.2 Me-cm, Millipore Inc.) performed by floating the etched PMMA/graphene film on the surface of the water. The resultant film was then transferred directly from the surface of the water onto an adhesive-backed polyester film (McMaster Carr) for incorporation into the subsequent microfluidic device. Because of the way in which the graphene films are released from the copper substrate, it is most straightforward to transfer the PMMA/graphene film onto the backing support in such a way that the graphene film faces outward, rather than directly towards the channel.

However, this assembly process can be performed in reverse, and no significant difference was observed in device performance comparing the two methods.

Device Architecture and Assembly

The overall chip architecture consists of five layers, which allow for various different functional layouts (FIG. 2A-FIG. 2D, FIG. 16A-FIG. 16D and FIG. 17A-FIG. 17D). The fluidic channels of the device were defined by a 100-µm thick cyclic olefin copolymer (COC, Topas, 6013) film. The channel structure was cut into this film using a cutting plotter (Graphtec CE6000). The channel was then sealed on one side with a PMMA/graphene film, supported by an adhesive-backed polyester film (McMaster Carr) with cut-out features to define fluidic inlets and/or window areas (FIG. 2A-FIG. 2D, FIG. 3A-FIG. 3D, FIG. 16A-FIG. 16D and FIG. 17A-FIG. 17D). Here, the backing layer provides additional structural stability, while helping to define inlets, and providing a facile way to adhere the various layers together. Following assembly of the COC fluidic layer to the adhesive bottom layer containing a PMMA/graphene film, both the top and bottom halves of the device were coated with PDA to create a hydrophilic surface and facilitate channel wetting.

Poly(Dopamine) (PDA) Surface Treatment

A 2 mg/mL solution of dopamine hydrochloride (Sigma) in 10 mM Tris buffer pH 8.5 (Fisher, Molecular Biology grade) was freshly prepared and then carefully dropped onto the PMMA/graphene films to cover the entire channel surface (FIG. 2A-FIG. 2D, FIG. 16A-FIG. 16D and FIG. 17A-FIG. 17D). The surfaces were allowed to incubate for at least 5 hours at room temperature (23° C.) in a sealed Petri dish. Following treatment, the films were rinsed by dipping into MilliQ water three times and allowed to air dry before final device assembly and use.

Raman Spectroscopy

Raman spectroscopy was used to validate the composition and quality of the resulting graphene-based films. Films were placed onto a silicon wafer coated with a 200 nm layer of silicon dioxide. Analysis was performed using a DXR™2xi Raman Imaging Microscope system (Thermo Scientific) with an incident beam of light at 633 nm on PMMA/graphene/PDA and PMMA/graphene films. These data were compared to the spectra for graphene, PMMA, and PDA-only films coated directly onto the silicon wafer (FIG. 4).

Permeability Measurements

Figure 5A:
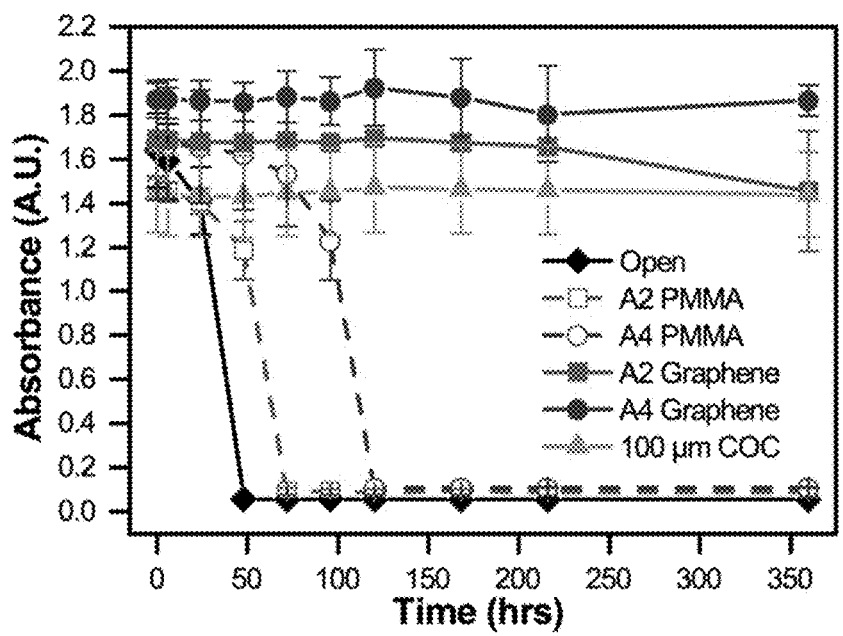
FIG. 5A Measurement of the absorbance of colored solutions as a function of time at 450 nm, demonstrating the water permeability of various PMMA, PMMA/graphene, and COC films. Both the thicker 100 μm COC film, and the two PMMA/graphene films show no significant decrease in signal over the course of more than two weeks.
Figure 5B:
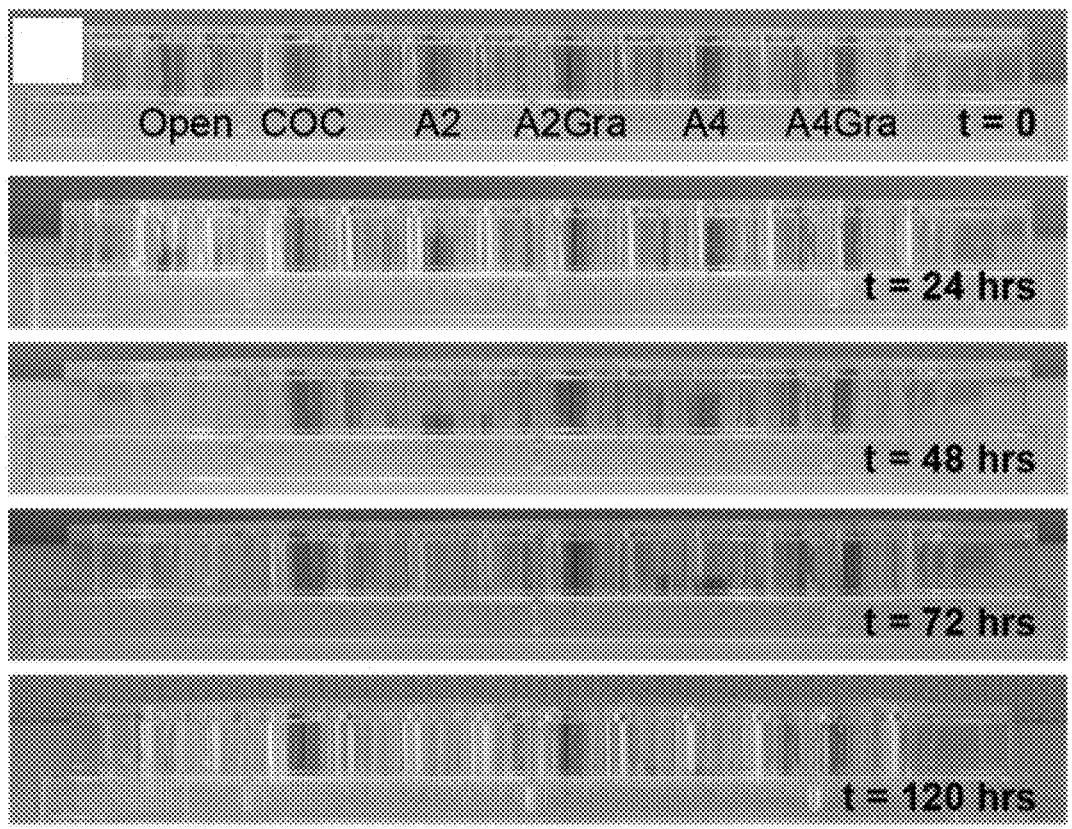
FIG. 5B Photographs of the experimental setup showing changes in the liquid levels as seen by a side-view.
Figure 6A:
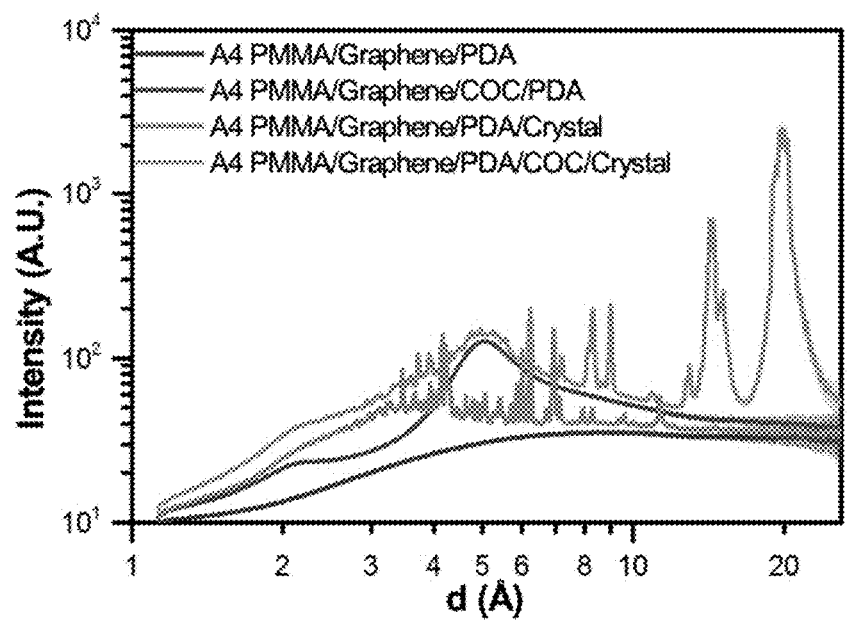
FIG. 6A One-dimensional integrated X-ray intensity profiles showing the relative strength of the observed diffraction signal from a HEWL crystal compared to the noise resulting from background scattering due to the presence of device materials as a function of resolution. The corresponding two-dimensional diffraction images for the FIG. 6B A4 PMMA/Graphene/PDA/COC/crystal dataset (orange), and the FIG. 6C A4 PMMA/Graphene/PDA/crystal dataset (magenta) shown in FIG. 6A.
Figure 6B:
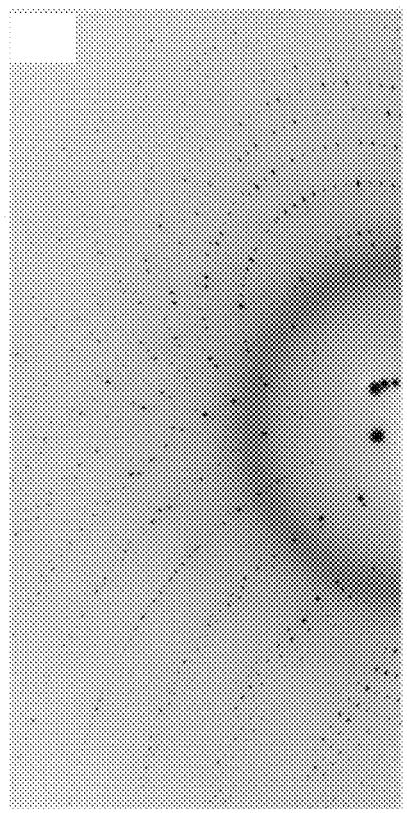
Figure 6C:
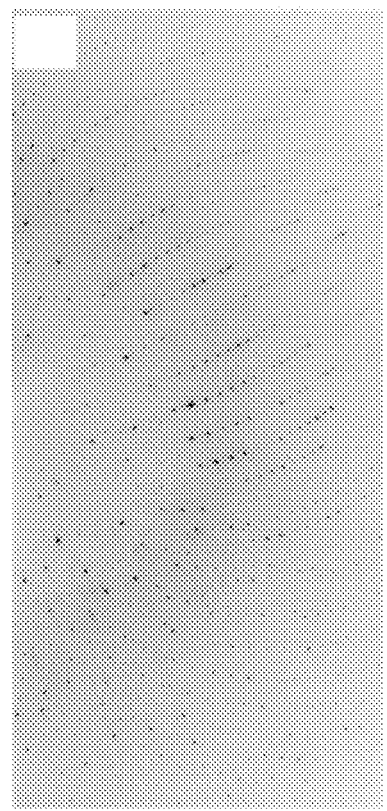

The permeation of water through the various thin film materials was quantified as a function of time by measuring the change in absorbance of an aqueous solution of red food dye (Kroger). Films of A2 PMMA, A4 PMMA, A2 PMMA/graphene, and A4 PMMA/graphene were adhered to an adhesive-coated polyester layer, as in FIG. 2A-FIG. 2D and FIG. 16A-FIG. 16D. These films, as well as a 100 µm COC were sealed with vacuum grease onto individual wells of a 96-well plate containing 300 µL of red food dye in water. The change in signal for these films was compared with wells that were left open to the air. All experiments were performed in triplicate. The solution absorbance was then monitored at 300 nm and 450 nm over time (FIG. 5A) using a plate reader (BioTek). Photographs of the well plate allowed for visual characterization of changes in the sample volume (FIG. 5B). In addition to direct measurements of water loss through films of the individual device materials, qualitative evaluation of water loss was evaluated directly using optical microscopy (FIG. 15A-FIG. 15D).

Contact Angle Measurements

A PMMA/graphene film was transferred from the aqueous rinse solution onto a silicon wafer (graphene-side down) and allowed to air dry 3 hours to facilitate strong binding between the film and the wafer surface. A PDA treatment was then applied to the PMMA film. The contact angle of both a treated and an untreated PMMA/graphene film were measured using goniometry with MilliQ water (Ramé-Hart).

AFM Characterization

Atomic force microscopy (AFM) was used to characterize the surface roughness of all films. Surface scans of PMMA-graphene and PDA coated PMMA-graphene (FIG. 18A-FIG. 18C) were acquired using the Cypher ES atomic force microscope (Asylum Research, Santa Barbara Calif.). Samples were imaged in AC mode with Tap-300G cantilevers (Budget Sensors).

Protein Crystallization

A solution of 80 mg/mL hen egg white lysozyme (HEWL, Hampton Research Inc.) was prepared in 50 mM sodium acetate buffer (Fisher Scientific, ACS grade), pH 4.8. A precipitant solution was prepared, containing 2M sodium chloride (Sigma Aldrich, ACS reagent) in 50 mM sodium acetate, pH 4.8. For microbatch experiments (FIG. 3C), 12 µL protein solution and 4 µL precipitant solution were pre-mixed and pipetted into the chip before the layers were sealed by simply pressing the adhesive layers together by hand. For counter-diffusion experiments using a channel-based chip architecture (FIG. 3D), 12 µL protein solution and 4 µL precipitant solution were pipetted separately onto the two device inlets. Because of the hydrophilic PDA surface treatment, the solutions wetted the channels and flowed into the device. The chip can be filled either by the sequential or simultaneous addition of crystallization solutions. However, due to the impermeability of the PMMA/graphene film, simultaneous filling of crystallization and precipitant solutions can lead to trapping of air within the device. The filled chip was placed into a Petri dish alongside a microcentrifuge containing 200 µL of DI water. The Petri dish was sealed with Parafilm (Thermo Scientific), and stored at 4° C. For both crystallization strategies, large lysozyme crystals (>100 µm) formed overnight. Crystals were visualized using a Zeiss V12 stereomicroscope with cross-polarizers (Carl Zeiss Microscopy LLC).

Microcrystals of trypsin were grown using standard procedures using a vapor diffusion setup and then transferred into a device for subsequent analysis. The crystal size was on the order of 20 µm×20 µm.

Caspase-7 was prepared in a buffer containing 120 mM NaCl and 20 mM Tris with a three molar excess of inhibitor (Ac-DEVD-cho or Ac-VEID-cho). Inhibited protein complexes were concentrated using Amicon Ultrafree 3K NMWL membrane concentrators (Millipore) to 4-8 mg/mL. Crystals were obtained in buffers containing 300 mM diammonium citrate, pH 6.5, 14% PEG 3350, 10 mM GuCl at 4° C. with a mixing ratio of 3:1.

On-Chip X-Ray Diffraction

Data for HEWL crystals were collected in polychromatic mode at 12 keV (1.03 Å, 5% bandwidth) on the 14-ID-B beamline at the Advanced Photon Source at Argonne National Laboratory. The microfluidic chips were mounted directly on the φ spindle of the goniometer using a modified magnetic mount (Hampton Research; FIG. 3A). Positioning and alignment of the chips was performed using a high-resolution camera oriented at 30° with respect to the X-ray beam and a medium-resolution camera oriented at 60°. This setup allowed for a range of motion of ±5 mm in x (focus, along the direction of the X-ray beam), ±6 mm in y (vertical with respect to the direction X-ray beam), and ±60 mm in z (horizontal with respect to the X-ray beam). Sample visualization and positioning were performed using an in-house graphical user interface at the 14-ID-B beamline. Sample positioning was achieved using a click-and-translate routine coupled to the high- and medium-resolution cameras. Sample centering along the path of the X-ray beam was achieved by visually focusing the sample, taking advantage of the very small depth of field of the high-resolution camera. The interface enabled identification and alignment of crystals on chip. BioCARS LaueCollect software was used for subsequent data acquisition.

Data were collected from microfluidic chips oriented between 45° and 45° with respect to the X-ray beam. The large size (~300 μm) and robustness of the HEWL crystals, combined with the small X-ray beam size (35×35 μm² FWHM), permitted the collection of multiple frames (3 or 4, see Table 1 and Table 3) of data from a large number of fresh crystal volumes on each individual crystal at room temperature. Data were typically collected at 3° intervals over the range of 45° and 45°. This spacing was chosen to enable optimal coverage of reciprocal space given the available X-ray bandwidth. Complete data sets were obtained by merging data taken from multiple volumes of the same crystal. Four different crystals grown and/or analysed under different conditions are compared (see FIG. 6A-FIG. 6C, Table 1, and Table 3). A Rayonix MX340-HS detector was used with a sample-to-detector distance of 175 mm. Diffraction data were collected using a 1.5 μs exposure with the storage ring operating in 24-bunch mode (11 consecutive X-ray pulses of 100 ps duration).

Data for trypsin microcrystals were collected as described above at the F1 beamline at the Cornell High Energy Synchrotron Source (CHESS) using 0.977 Å X-rays and a Pilatus 6M detector. The nominal spot size for the X-ray beam was 20 μm, matching that of the crystal size. X-ray diffraction was observed. Data collection was performed at a sample-to-detector distance of 300 mm using a 1s exposure and a 1° oscillation. Diffraction was observed to the edge of the detector.

Data for caspase 7 crystals were collected at the 12-2 beamline at the Stanford Synchrotron Radiation Source (SSRL) using 12.657 keV X-ray radiation, a 20 μm×20 μm X-ray beam, and a Pilatus 6M detector.

Data Analysis

Laue diffraction images were processed using the Precognition/Epinorm software (Renz Research; Table 1). Each crystal was processed separately. Microbatch data were integrated to 1.40 Å resolution, counter-diffusion data to 1.45 Å and ultimately merged to a final resolution that was chosen both to maintain a completeness in the highest resolution shell, of at least 25%, provided that $I/\sigma(I)$ remains above 3. Subsequent processing of crystallographic data sets is carried out using both the CCP4 suite of programs and PHENIX. Structure refinement (Table 1) was carried out using PHENIX.refine starting from PDB model 193L in a fully automated fashion for 20 cycles, including optimization of atomic coordinates, real-space refinement, individual B-factors, TLS parameters and occupancies, while taking advantage of simulated annealing (Cartesian), automatically correcting N/Q/H errors, and updating waters.

Analysis of the background signal-to-noise (FIG. 6A-FIG. 6C) was done using the Nika software suite for 2D diffraction data reduction in Igor Pro (Wavemetrics Inc.). Integration of diffraction images in 20 with log binning was performed using the calibrated beam center and sample-to-detector distance obtained from geometry refinement in Precognition.

Monochromatic data were visualized using X-ray data collection software such as Adxv, available at the beamline, to examine the strength of the diffraction signal (FIG. 22A-FIG. 22B).

X-Ray Compatibility

In designing an X-ray transparent microfluidic device for use in protein crystallography three main considerations with respect to the interaction between materials and X-rays must be taken into account: (i) attenuation and (ii) scattering of X-rays passing through device materials, and (iii) the strength of the diffraction resulting from a crystal. Attenuation results from the absorption of photons into the material, thereby decreasing the intensity of both the incident X-ray beam and the resultant signal. Scattering is an elastic redirection of photons based on the internal structure of the material and can affect the signal-to-noise. The strength of the diffraction signal from a crystal is related to not only the degree of order within the crystal, but also the packing density and size of the crystal.

Attenuation can be calculated for a particular energy based on the exponential decay in intensity of a narrow beam of monochromatic photons from an incident intensity $I_0$ as it passes through a material of thickness x with a linear attenuation coefficient of the material μ. (Cusack, et al. *Nat. Struct. Mol. Biol.*, 1998, 5, 634-637; Riekel, *NanoWorld J*, 2015, 1, 71-76.)

$$I=I_0\exp(-\mu x) \quad (S1)$$

For a compound containing multiple elements, a linear attenuation coefficient can be calculated based on the sum of the contribution to attenuation from each of the individual elements i, weighted based on their mass fraction $w_i$.

$$\mu=\Sigma\mu_i w_i \quad (S2)$$

Table 2 lists the chemical and atomic mass fractional compositions of various materials commonly used in microfluidic device manufacture. Calculated values for the linear attenuation coefficient for $SiO_2$, $Si_3N_4$, PDMS, COC, PMMA, graphene, and PDA can then be graphed as a function of either photon energy (FIG. 9A) or X-ray wavelength (FIG. 9B). As can be seen, the attenuation coefficient varies significantly as a function of photon energy. Soft X-rays (lower energy) attenuate much more strongly than do harder X-rays (higher energy), thus the energy of X-rays used for an experiment can have a significant effect on the signal observed from a device.

TABLE 2

Atomic mass fraction, density, and a calculated value for the linear attenuation coefficient μ at 1Å (12.4 keV) for various materials used in microfluidic devices

| Element | Air | Quartz $SiO_2$ | PDMS $Si_{61}O_{60}C_{124}H_{368}$ | Silicon Nitride $Si_3N_4$ | COC $C_9H_{14}$ | PMMA $C_5H_8O$ | Graphene C | PDA $C_8H_5NO_2$ |
|---|---|---|---|---|---|---|---|---|
| H | — | — | 0.08182 | — | 0.11546 | 0.09586 | — | 0.03552 |
| C | 0.00015 | — | 0.32853 | — | 0.88454 | 0.71394 | 1.00000 | 0.67623 |

TABLE 2-continued

Atomic mass fraction, density, and a calculated value for the linear attenuation coefficient μ at 1Å (12.4 keV) for various materials used in microfluidic devices

| Element | Air | Quartz $SiO_2$ | PDMS $Si_{61}O_{60}C_{124}H_{368}$ | Silicon Nitride $Si_3N_4$ | COC $C_9H_{14}$ | PMMA $C_5H_8O$ | Graphene C | PDA $C_8H_5NO_2$ |
|---|---|---|---|---|---|---|---|---|
| N | 0.75518 | — | — | 0.39938 | — | — | — | 0.09857 |
| O | 0.23179 | 0.53257 | 0.21175 | — | — | 0.19020 | — | 0.22520 |
| Si | 0.01288 | 0.46743 | 0.37791 | 0.60062 | — | — | — | — |
| Density (g/cm³) | 0.001225 | 2.65 | 0.92 | 3.2 | 1.02 | 0.94 | 1.80 | 1.03 |
| μ at 1Å (cm⁻¹) | 0.00291 | 50.7 | 39.5 | 10.8 | 5.80 | 7.82 | 6.51 | 8.87 |

Figure 10A:
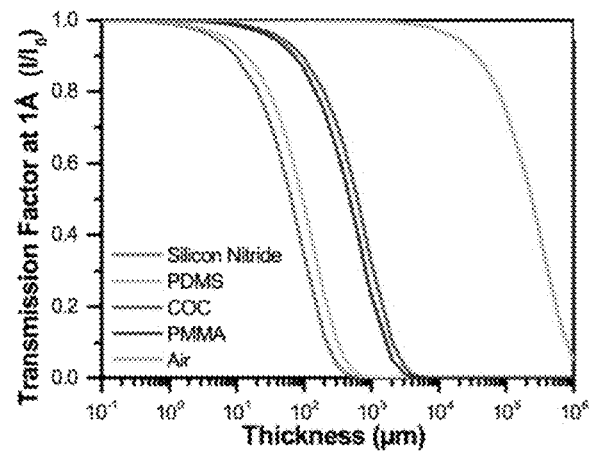
FIG. 10A A comparison of the transmission factors $I/I_0$ for varying thicknesses of silicon nitride, PDMS, COC, and PMMA at a photon energy of 12.4 keV, or a wavelength of 1 Å.
Figure 10B:
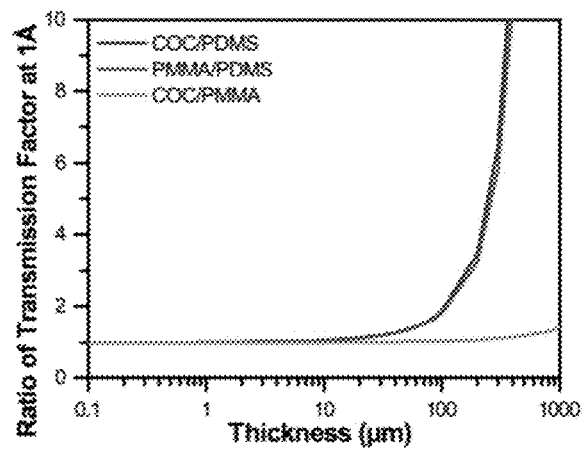
FIG. 10B Quantification of the ratio of transmission factors $I/I_0$ at 1 Å between COC/PDMS, PMMA/PDMS, and COC/PMMA. A comparison between the transmission factors $I/I_0$ for various graphene-PMMA-PDA architectures FIG. 10C, FIG. 10D and previously-reported X-ray compatible PDMS-COC device architectures FIG. 10E, FIG. 10F and as a function of X-ray energy FIG. 10C, FIG. 10E or wavelength FIG. 10D, FIG. 10F.
Figure 10C:
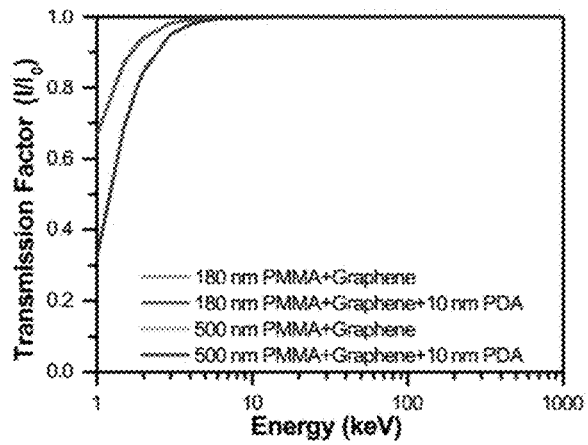
Figure 10D:
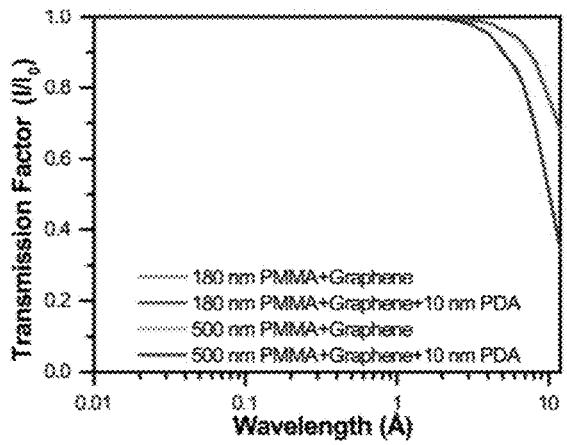
Figure 10E:
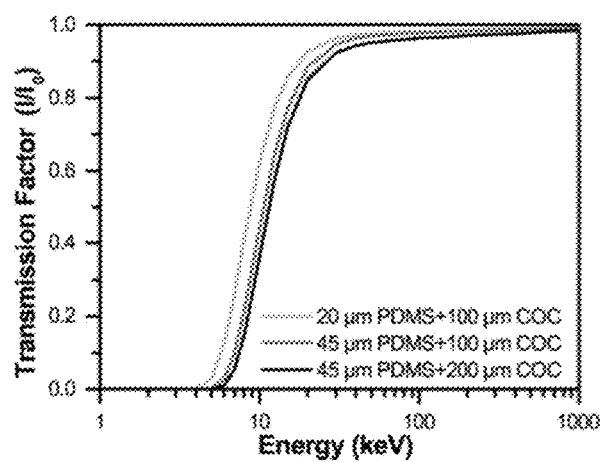
Figure 10F:
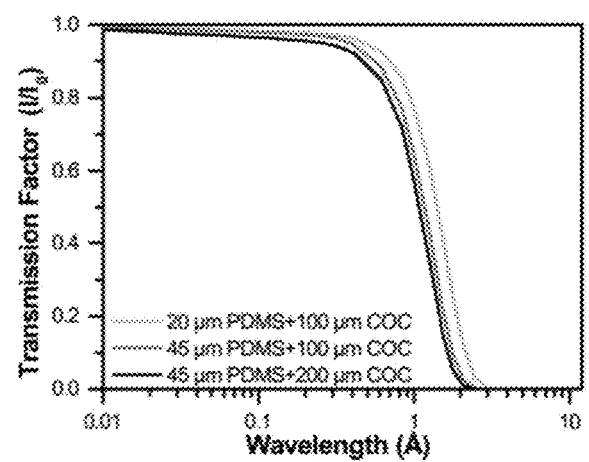

Using values for the attenuation coefficient, the transmission factor $I/I_0$ can then be calculated as a function of material thickness. A plot of $I/I_0$ vs. film thickness at a photon energy of 12.4 keV, or a wavelength of 1 Å, is shown in FIG. 10A, comparing the attenuation effects of silicon-rich materials such as PDMS and lower atomic number organic thin films like COC and PMMA. As an be seen in FIG. 10B, the difference in X-ray attenuation comparing the various films becomes increasingly significant with increasing film thickness. These calculations can be extended for typical microfluidic device architectures at different X-ray energies (FIG. 10C-FIG. 10F). Here, differences in both the atomic number content and the overall device thickness comparing the graphene-based microfluidic device architectures (FIG. 10C-FIG. 10D) with previously-reported PDMS-COC (FIG. 10E-FIG. 10F) devices demonstrates the tremendous decrease in the overall loss of signal from the devices, and suggests the potential for significantly higher signal-to-noise.

Several interesting observations can be made from the data presented in Table 2 and FIG. 9A-FIG. 9B. PDMS and PMMA have very similar densities; however the linear attenuation coefficient for PDMS is significantly higher. This difference arises from the silicon content in PDMS. Heavier atoms present a larger cross-section for interacting with photons and will thus cause a larger degree of attenuation. The density of a material also plays a role in the degree of attenuation observed, with higher density materials increasing the number of atoms which can interact with a photon for a given path length, though this effect is less significant than elemental composition.

Knowing the attenuation coefficient for various materials, an expression for the attenuation through a series of different films/can be calculated based on Eq. (51).

$$I = I_0 \exp(-\Sigma \mu_j x_j) \quad (S3)$$

FIG. 10C-FIG. 10F shows comparison of the transmission factor as a function of X-ray energy (or wavelength) for different graphene-based devices tested here, and PDMS-based device geometries reported previously. At an X-ray energy of approximately 12.4 keV (1 Å), transmission through the PDMS-based devices was in the range of 57-77%. This level of signal transmission was sufficient to enable the collection of high quality X-ray data from relatively large crystals. However, the 99.9% signal transmission from the ultra-thin graphene-based devices will enable data collection from microcrystals. To achieve a similar level of signal transmission from ultra-thin, microfabricated silicon nitride windows would require a thickness of 100 nm. While windows of this thickness have been reported successfully, such devices cannot be manufactured with the same ease and low cost as soft lithographic and replica molding-based approaches.

Background Scattering and Signal-to-Noise

Figure 11A:
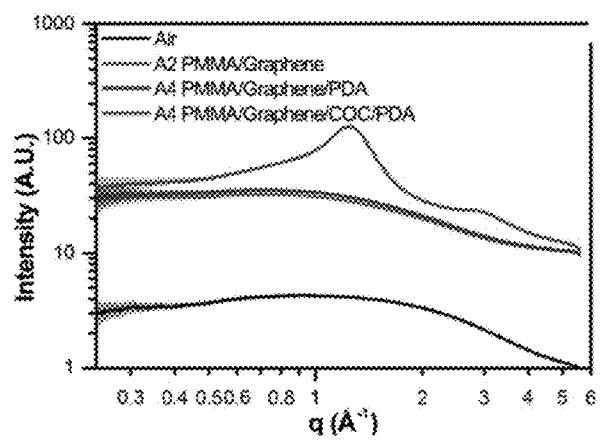
FIG. 11A-FIG. 11D. One-dimensional integrated X-ray intensity profiles showing the background scatter resulting from various device geometries.
Figure 11B:
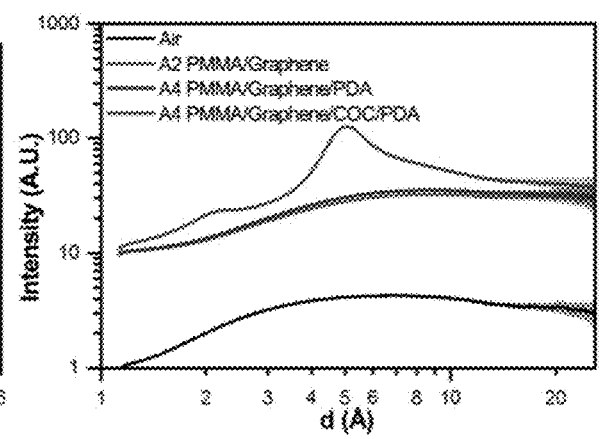
Figure 11C:
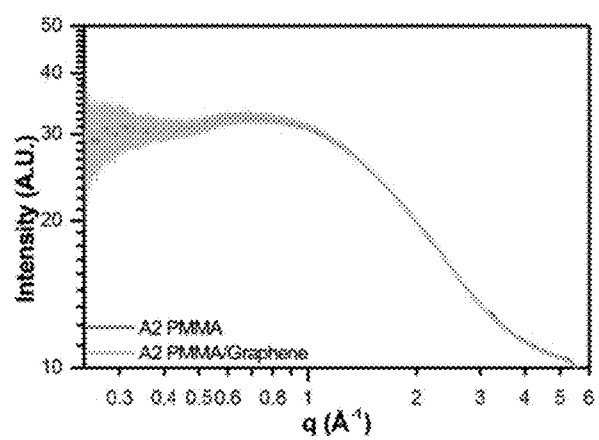
Figure 11D:
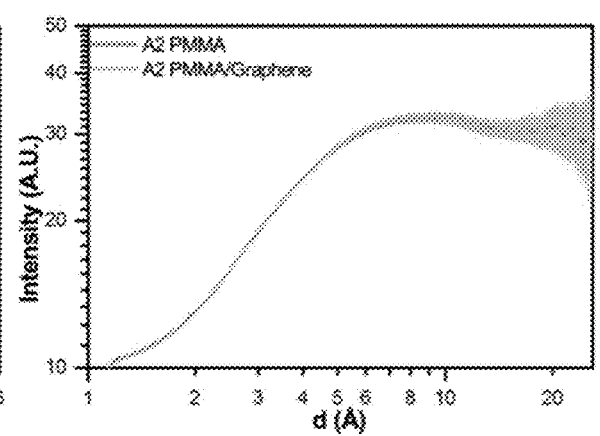
Figure 12A:
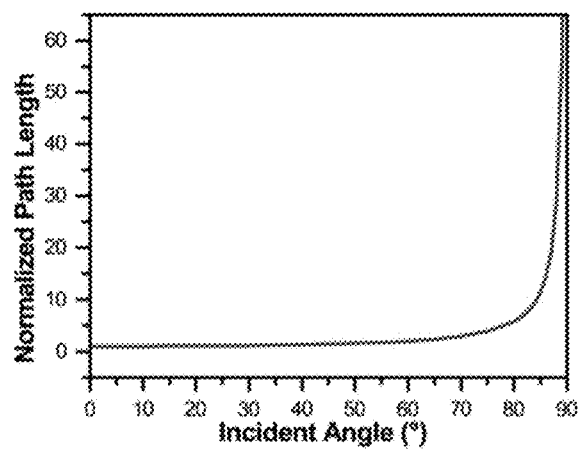
FIG. 12A Normalized path length as a function of incident angle, calculated using Eq. (S4).
Figure 12B:
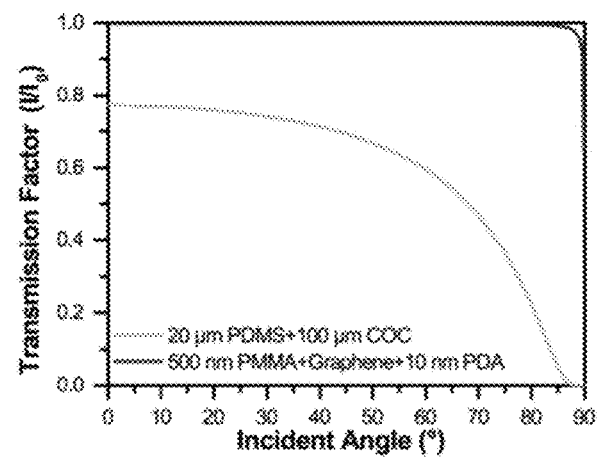
FIG. 12B A comparison of the transmission factors $I/I_0$ for a typical COC/PDMS-based and a PMMA/graphene-based device.
Figure 12C:
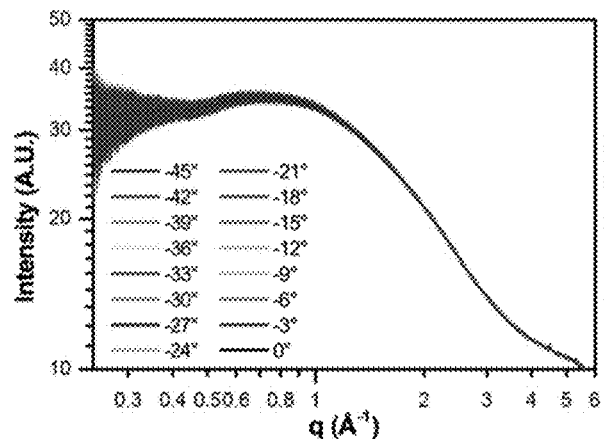
FIG. 12C One-dimensional integrated X-ray intensity profiles showing the effect of incident angle on the background signal resulting from an empty 500 nm PMMA/graphene/PDA device as a function of q-space.
Figure 12D:
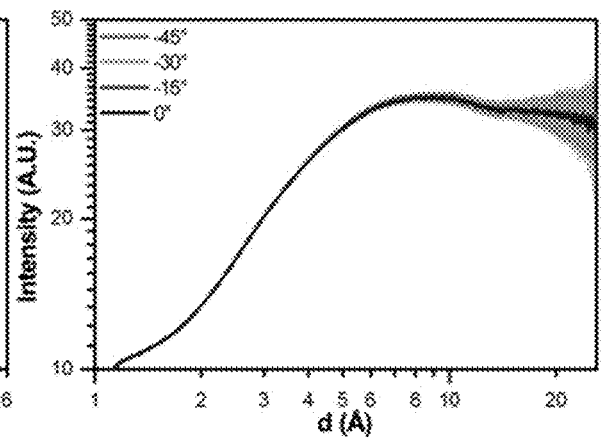
FIG. 12D A subset of the data from FIG. 12C, plotted as a function of resolution, or d-spacing.
Figure 13A:
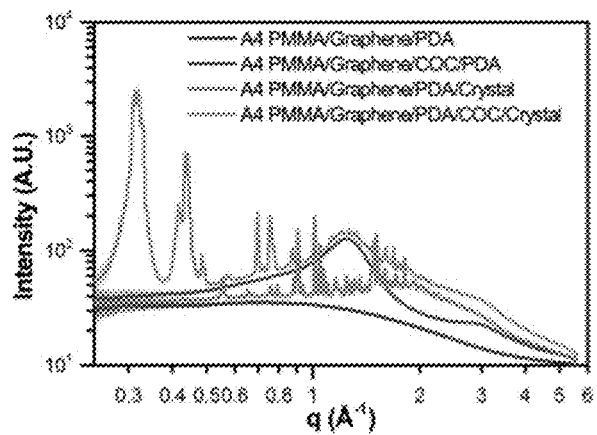
FIG. 13A-FIG. 13D. One-dimensional integrated X-ray intensity profiles showing the relative strength of the observed diffraction signal from a HEWL crystal compared to the noise resulting from background scattering due to the presence of device materials as a function of q-space FIG. 13A or d-spacing FIG. 13B. A significant decrease in signal-to-noise is observed in the regions where significant scattering results from a 100 μm COC layer. The corresponding two-dimensional diffraction images for the FIG. 13C A4 PMMA/Graphene/PDA/COC/Crystal dataset (orange), and the FIG. 13D A4 PMMA/Graphene/PDA/Crystal dataset (magenta) shown in FIG. 13A and FIG. 13B.
Figure 13B:
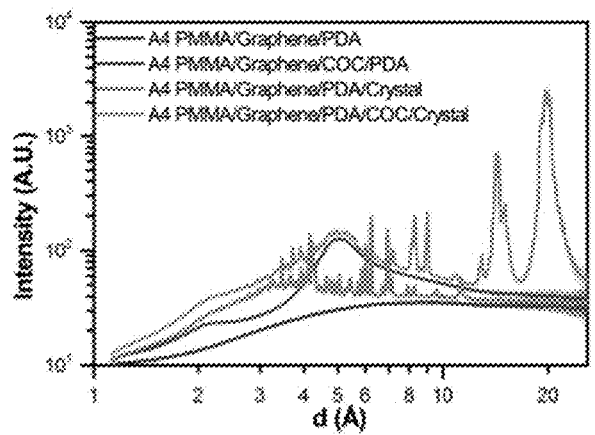
Figure 13C:
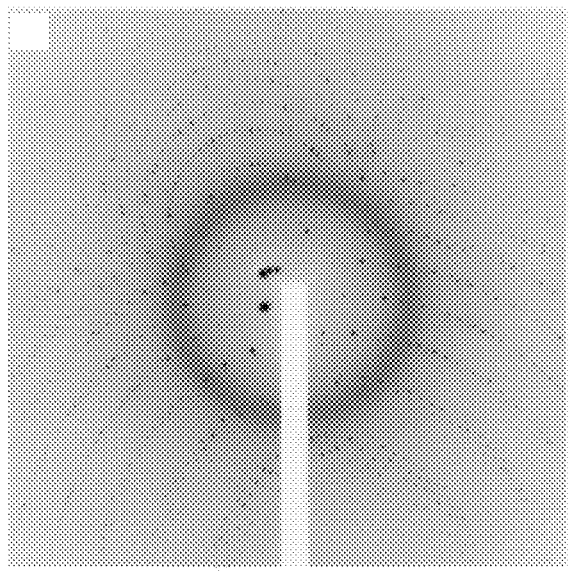
Figure 13D:
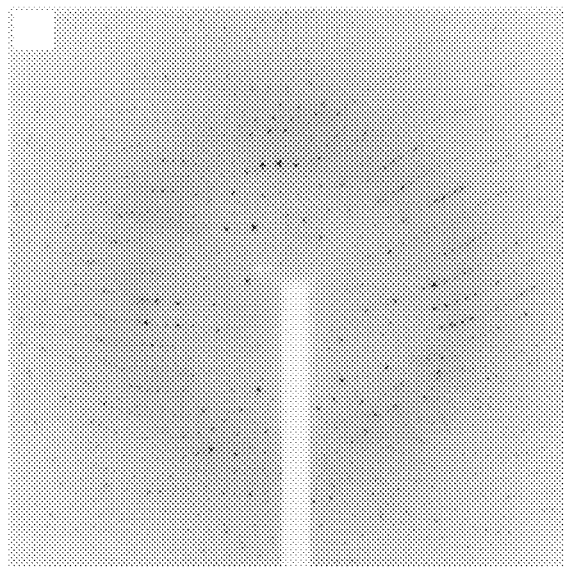

In addition to attenuation, background scatter from the device materials can adversely affect the resultant signal-to-noise. Scattering is a result of the internal structure of a material. Thus the characteristic length-scale of this internal geometry defines the location of this scattering signal. For instance, scattering rings resulting from a relatively thick layer of COC can be clearly observed above the overall envelope shape of the amorphous background (FIG. 11A, FIG. 11B). The intensity of these background scattering signals scales in a roughly linear fashion with sample thickness.

Because crystallography experiments commonly involve sample rotation, variations in path length as a function of the incident angle also need to be taken into account. The effect of incident angle on the apparent path length (relative to the minimum path length achieved when the chip is mounted perpendicular to the X-ray beam at $\phi=0°$) can be estimated simply by: (FIG. 12A-FIG. 12D).

$$\text{path length} = \frac{1}{\cos(\phi)} \quad (S4)$$

However, the observed levels of background scatter are only relevant when compared to the strength of the diffraction signal from a crystal of interest. In this sense, while the overall level of background scattering could ultimately swamp the entire diffraction signal, the challenge with material-specific scattering rings is the potential for the loss of data over a particular range of resolution or q-space. The objective, in developing ultra-thin graphene-based microfluidics is to enable the collection of X-ray diffraction data from either tiny, or weakly diffracting crystals to enable serial crystallography. FIG. 13A-FIG. 13D shows comparison of the observed signal-to-noise in previously-reported COC/PDMS-based devices, compared with the PMMA/graphene-based devices reported here. Both the 2D diffraction images and the integrated 1D intensities clearly demonstrate the significant loss in signal-to-noise resulting from the COC scattering ring. This challenge was eliminated in the PMMA/graphene-based devices by decreasing the overall thickness of the polymeric layer by approximately two orders of magnitude. It should be noted that the data presented in FIG. 6A-FIG. 6C and FIG. 13A-FIG. 13D is the result of integration in 20 across the entire image, rather than along a line. Thus, the presence of multiple diffraction peaks at nearly the same resolution could result in apparent broadening of the integrated signal. All images were well exposed, typically with several saturated diffraction spots (~65,000 counts). Similar levels of high signal-to-noise were observed for microcrystals of trypsin and caspase 7 (FIG. 22A-FIG. 22B).

Film Permeability Tests

One of the most significant challenges in decreasing the overall thickness of the microfluidic device architecture was the need to avoid evaporative losses from the device over time. Most protein crystallization experiments require days or weeks to allow for crystal growth. While the devices could be stabilized in a controlled humidity environment during this time, the challenge of device stability during transportation and data collection remains. However, the goal is to create a microfluidic device architecture that can enable a stable, stand-alone environment for a period of weeks or months. This would allow for microfluidic crystallization approaches to better mimic current well plate-based technologies, and facilitate translation to a broader audience of users. To quantify the loss of water through the device materials as a function of time, the films were attached to an adhesive polyester film with an opening cut to match the well plate structure as a mimic of the device geometry. These films were then sealed over the wells via vacuum grease, to isolate 300 µL of a solution of red food dye in water in a 96-well plate. All samples were performed in triplicate. The absorbance of the colored solutions was then monitored at 300 nm and 450 nm using a plate reader as a function of time. The results in FIG. 14A-FIG. 14D and FIG. 5A-FIG. 5B clearly show the evaporative loss of water from the open-well control samples after a period of 48 hours. The presence of a PMMA film delayed this process, with some improvement observed with increasing film thickness. However, the addition of a single layer of graphene as a diffusion barrier was able to prevent the loss of water and stabilize the samples for more than two weeks. Similar results were obtained with a 100 µm-thick film of COC, which was expected to show low water permeability. These experiments also demonstrate that lateral diffusion of water between layers is not a significant concern for the device architecture.

Additional permeability experiments were performed directly in microfluidic devices, again using colored solutions for visualization purposes. A comparison was run for devices stored under ambient laboratory conditions and chips stored in sealed petri dishes containing 200 µL of water and 4° C. to create a humidified environment. Both the microbatch and the counter-diffusion device architectures were investigated (FIG. 15A-FIG. 15D). Visual inspection of microbatch devices (FIG. 15A) devices indicated no significant water loss over the course of 96 hours, regardless of storage conditions. It is interesting to observe differences in the timing and growth of lysozyme crystals from these solutions, which is attributed to temperature-related differences in protein solubility.

While microbatch trials indicated a very stable sample environment, more significant water permeation was observed from the counter-diffusion device geometry (FIG. 15B). Following incubation at ambient laboratory conditions, significant water loss was observed from the counter-diffusion chip over the course of only 8 hours, with complete evaporation of the ~2 sample volume observed between 1-2 days. Interestingly, incubation at 4° C. in a humidified environment alleviated this issue, and produced stable samples for more than 6 days. It was hypothesized that the stable microbatch sample environment is due to complete coverage of the sample chamber by PMMA/graphene films. However, for the counter-diffusion chips used here, graphene windows only covered the large sample chamber, rather than the entirety of the device. Future device designs have addressed this issue.

Device Fabrication

The overall chip architecture consists of five layers, which allow for various different functional layouts (FIG. 2A-FIG. 2D and FIG. 16A-FIG. 16D). The fluidic channels of the device are defined by a 100 µm thick cyclic olefin copolymer (COC, Topas, 6013) film, although this could be easily substituted for an alternative material and/or thickness film. This spacer layer defines the overall thickness of the device. The overall device structure was cut into the spacer film using a cutting plotter (Graphtec CE6000). In the microbatch-style devices, this structure consisted simply of a cut-out circle, whereas for a counter-diffusion architecture, a more complex channel geometry was utilized (FIG. 2A-FIG. 2D, FIG. 16A-FIG. 16D and FIG. 17A-FIG. 17D). For both of these structures, care was taken to include support structures to prevent collapse of the thin PMMA/graphene film. These can be seen as small tabs of COC that extend into the large crystallization chamber for both microbatch and counter-diffusion, and the thin strip of material bifurcating the inlet channels in the counter-diffusion chip (FIG. 2A-FIG. 2D, FIG. 3A-FIG. 3C).

The microfluidic channels and/or chambers were then sealed on one side with a PMMA/graphene film, supported by an adhesive-backed polyester film (McMaster Carr) with cut-out features to define fluidic inlets and/or window areas, as necessary (FIG. 2A-FIG. 2D, FIG. 3A-FIG. 3C and FIG. 16A-FIG. 16D). Here, the backing layer provides additional structural stability, while helping to define inlets, and providing a facile way to adhere the various layers together. Following assembly of the COC fluidic layer to the adhesive bottom layer containing a PMMA/graphene film, both the top and bottom halves of the device were coated with poly(dopamine) (PDA) to create a hydrophilic surface and facilitate channel wetting, before final device assembly and use (FIG. 2A-FIG. 2D, FIG. 16A-FIG. 16D and FIG. 17A-FIG. 17D).

Atomic Force Microscopy (AFM)

Figure 18A:
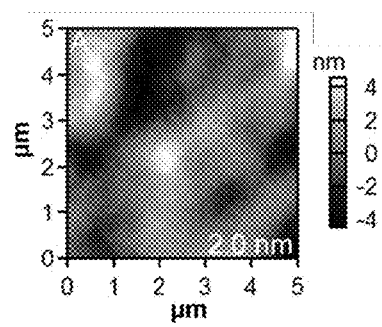
FIG. 18A-FIG. 18C. AFM topography micrographs of FIG. 18A 500 nm PMMA on graphene, FIG. 18B 500 nm PMMA coated with PDA on graphene, and FIG. 18C 180 nm PMMA coated with PDA on graphene. Deposition of PDA onto PMMA had minimal effect on surface roughness although PDA aggregation was slightly larger on thicker PMMA surfaces with isolated aggregates up to 0.5 μm.
Figure 18B:
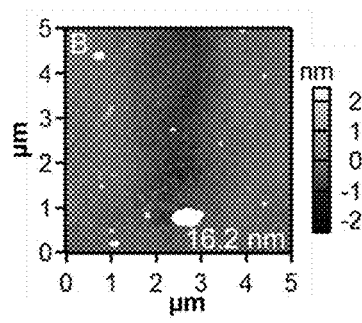
Figure 18C:
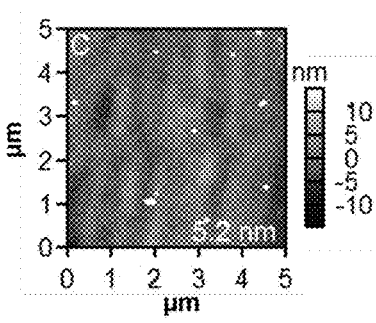

Atomic force microscopy (AFM) was used to characterize the surface roughness of the various films. Surface scans of PMMA/graphene and PDA coated PMMA/graphene were acquired using the Cypher ES atomic force microscope (Asylum Research, Santa Barbara Calif.). Samples were imaged in AC mode with Tap-300G cantilevers (Budget Sensors). The PMMA/graphene films showed a very smooth surface, with a level of roughness characteristic of the original copper substrate from CVD graphene synthesis (FIG. 18A). The deposition of PDA onto PMMA had minimal effect on surface roughness although PDA aggregation was slightly larger on thicker PMMA surfaces, where isolated aggregates were observed up to a size of 0.5 µm (FIG. 18B, FIG. 18C).

Contact Angle Measurements

A PMMA/graphene film was transferred from the aqueous rinse solution onto a silicon wafer (graphene-side down) and allowed to air dry 3 hours to facilitate strong binding between the film and the wafer surface. A PDA treatment was then applied to the PMMA film. The contact angle of both a treated and an untreated PMMA/graphene film were measured using goniometry with MilliQ water (Ramé-Hart). The untreated PMMA film showed a contact angle of 74° (FIG. 19A). Following a 5 hour PDA treatment, this contact angle dropped to 36° (FIG. 19B), easily facilitating capillary-driven flow into the microfluidic channels.

Protein Crystallography

Data collection was performed in polychromatic mode 12 keV (1.03 Å, 5% bandwidth) on the 14-ID-B beamline at the Advanced Photon Source at Argonne National Laboratory.

Data were collected in a pseudo-serial fashion using a 1.5 μs exposure from a micro-focused polychromatic X-ray beam (spot size of 35×35 μm², FWHM), and the storage ring operating in 24-bunch mode (11 consecutive X-ray pulses of 100 ps duration). A Rayonix MX340-HS detector was used, with a sample-to-detector distance of 175 mm. The microfluidic chips were mounted directly on the φ spindle of the goniometer using a modified magnetic mount (Hampton Research; FIG. 3A). Data were typically collected at 3° intervals over the range of −45° and 45°. This spacing was chosen to enable optimal coverage of diffraction space given the bandwidth of the beamline at 12 keV.

Figure 20:
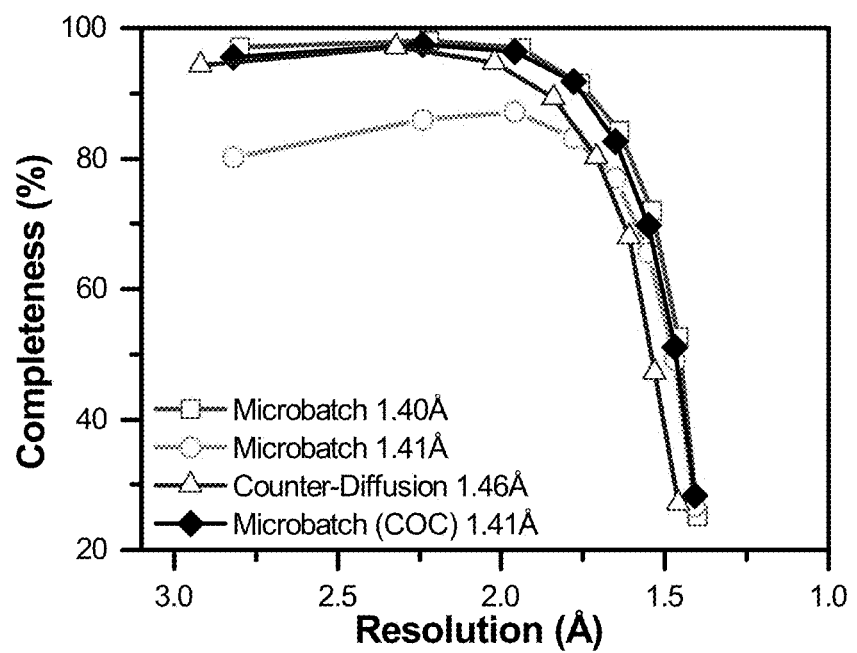
FIG. 20. Graph of completeness vs. resolution for the four datasets shown in Table 3. The final resolution of the dataset is indicated in the legend.

The crystals grown in the PMMA/graphene devices were large enough to enable the collection of data from multiple different independent locations. First determined was the usable lifetime of the crystals by attempting to collect a 90° dataset for the tetragonal HEWL crystals (31 frames total, 3° intervals from −45° and 45°). A significant decrease was observed in resolution, along with a significant increase in sample mosaicity, as evidenced by radial streaking of diffraction spots, after only 16 exposures. Moving forward, only 3-4 frames of data were chosen to be collected from an individual location, so as to minimize the effects of radiation damage, while allowing for collection of a complete dataset.

the thicker COC film. This result may be due to the relatively strong diffraction signals expected from the large crystals. High quality crystallographic statistics were observed for all samples; however, the presence of the thick COC film did correspond with an increase in the values for $R_{merge}$, and a decrease in signal-to-noise, characterized by $<F/\sigma(F)>$. The resolution cutoff was defined as the point where completeness in the highest resolution shell dropped below 25%, provided that $<F/\sigma(F)>$ was greater than 3.0. The difference in criteria for determination of a resolution cutoff for Laue data, as compared to monochromatic data, is related to the polychromatic nature of the diffraction, which results in a less abrupt loss of signal at the resolution edge. FIG. 20 shows a plot of completeness vs. resolution for each of the datasets shown in Table 3. This plot demonstrates the high levels of completeness present over much of the resolution range, and the gradual loss of completeness at high resolution. Thus, while the reported statistics in Table 3 have the appearance of incompleteness, the lower average value of completeness over all hkls is merely a consequence of averaging and of the characteristics of Laue data.

The presence of a 100 μm-thick COC layer also had a significant effect on the observed signal-to-noise. An analysis of $<F/\sigma(F)>$ as a function of resolution (FIG. 7) dem-

TABLE 3

Crystallographic statistics for data obtained using on-chip micro-diffraction Laue analysis of various HEWL crystals. Values in parentheses are for the highest integrated resolution shell

| Parameter | Microbatch PMMA/Graphene | Microbatch PMMA/Graphene | Microbatch PMMA/Graphene/COC | Counter-Diffusion PMMA/Graphene |
|---|---|---|---|---|
| Data Collection | | | | |
| Total # Frames | 55 | 32 | 59 | 30 |
| # Frames/Spot | 3 | 4 | 4 | 3 |
| Resolution (Å) | 50-1.40 | 50-1.41 | 50-1.41 | 50-1.46 |
| Space Group | $P4_32_12$ | $P4_32_12$ | $P4_32_12$ | $P4_32_12$ |
| Unit Cell Dimensions (Å) | a = b = 79.1, c = 37.7 | a = b = 79.1, c = 37.6 | a = b = 79.1, c = 37.3 | a = b = 79.1, c = 37.8 |
| Single Reflections | | | | |
| Total Observations | 150,678 | 90,828 | 143,638 | 70,996 |
| Unique Observations | 18,294 | 15,991 | 17,608 | 15,629 |
| Redundancy | 8.2 | 5.7 | 8.2 | 4.5 |
| $R_{merge}$ on $F^2$ | 0.054 | 0.049 | 0.077 | 0.047 |
| $R_{merge}$ on F | 0.036 | 0.032 | 0.049 | 0.031 |
| $<F/\sigma(F)>$ | 63.9 (28.6) | 62.0 (41.9) | 50.7 (19.9) | 60.4 (33.4) |
| Single and Multiple Reflections Combined | | | | |
| Completeness (%) | 77.2 (25.1) | 69.4 (26.7) | 76.6 (28.4) | 74.8 (27.1) |
| Structure Refinement | | | | |
| $R_{work}$ | 0.149 | 0.145 | 0.156 | 0.145 |
| $R_{free}$ | 0.163 | 0.166 | 0.176 | 0.167 |
| Ramachandran Statistics | | | | |
| Favored Residues | 123 (96.9%) | 123 (96.9%) | 122 (96.1%) | 122 (96.1%) |
| Allowed Residues | 4 (3.1%) | 4 (3.1%) | 5 (3.9%) | 5 (3.9%) |
| Disallowed Residues | 0 (0.0%) | 0 (0.0%) | 0 (0.0%) | 0 (0.0%) |

Data were collected on three separate crystals grown in the same microbatch-style device. Two of the microbatch-grown crystals were located between the PMMA/graphene window structures, while the third grew opportunistically under the COC spacer. This provided us with the opportunity to directly compare differences in the quality of diffraction data achievable with the ultra-thin device geometry, with thicker X-ray compatible device designs (Table 3). All samples showed excellent signal-to-noise and values for $R_{merge}$, $R_{work}$, and $R_{free}$. Interestingly, a significant decrease was not observed in resolution for the crystal present under onstrated that data collected through a more attenuating material, and the presence of increased background scatter, have a negative effect on the overall sensitivity of the measurement. This decrease in signal-to-noise was observed despite similar levels of completeness and redundancy in the overall dataset, compared with data collected through PMMA/graphene windows. In particular, a significant decrease in $<F/\sigma(F)>$ is observed at a resolution of ~2.5 Å. This corresponds with the location of the smaller of the scattering bands observed for COC in FIG. 11B and FIG. 13B. The effect of the larger scattering band observed at ~5.0

Å was not observable in this data, due to the range of resolutions over which the binned <F/σ(F)> data were provided by the processing software.

Figure 21A:
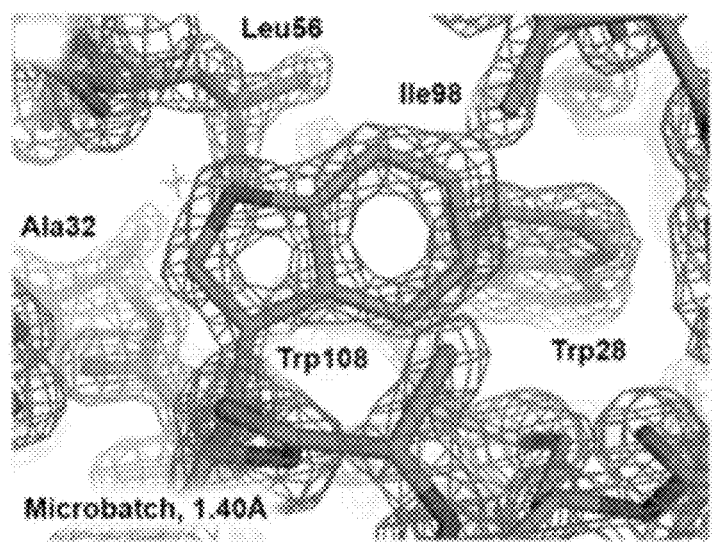
FIG. 21A-FIG. 21C. $2F_o$-$F_c$ electron density maps of HEWL grown in FIG. 21A microbatch to 1.40 Å, FIG. 21B microbatch under a 100 μm COC film to 1.41 Å, and FIG. 21C counter-diffusion to 1.46 Å. Maps are contoured at 2σ and superimposed over a licorice representation of the protein structure surrounding Trp108.
Figure 21B:
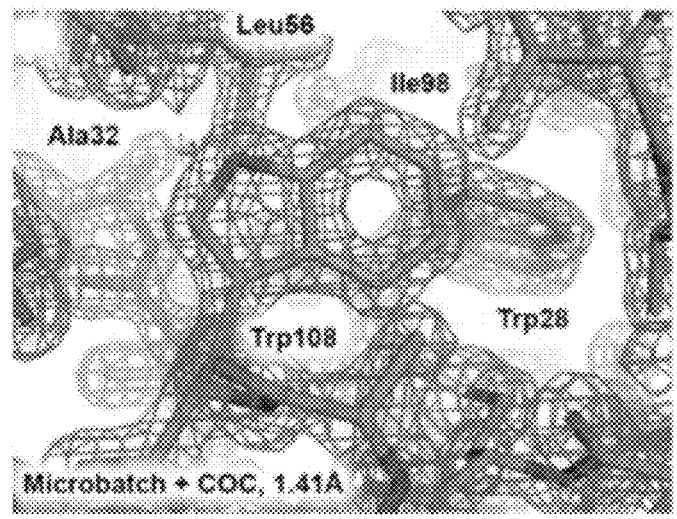
Figure 21C:
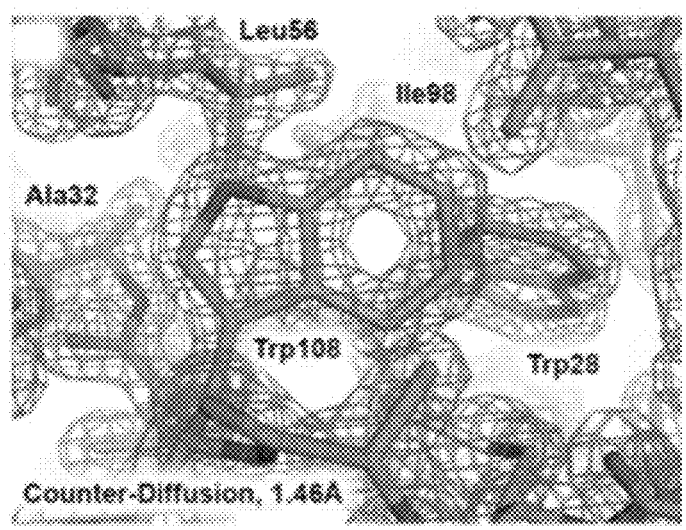

In addition to the microbatch data, also collected was data from a crystal that was grown via counter-diffusion. Comparison of crystallographic statistics does not indicate any significant difference in the overall quality of results obtained for these two techniques, which is expected for HEWL. However, in general, the counter-diffusion method would be expected to result in more reproducible crystal growth, due to the precise control over concentration gradients, diffusion, and mixing afforded by microfluidic devices. Examination of the electron density maps generated from these various datasets show similar levels of structural detail, as would be expected from data extending to ~1.40 Å (FIG. 21A-FIG. 21C). The quality of the data allows for unambiguous interpretation of structural details, including side-chain conformations and the location of bound water molecules.

Applicant's disclosure is described herein in preferred embodiments with reference to the Figures, in which like numbers represent the same or similar elements. Reference throughout this specification to "one embodiment," "an embodiment," or similar language means that a particular feature, structure, or characteristic described in connection with the embodiment is included in at least one embodiment of the present invention. Thus, appearances of the phrases "in one embodiment," "in an embodiment," and similar language throughout this specification may, but do not necessarily, all refer to the same embodiment.

The described features, structures, or characteristics of Applicant's disclosure may be combined in any suitable manner in one or more embodiments. In the description, herein, numerous specific details are recited to provide a thorough understanding of embodiments of the invention. One skilled in the relevant art will recognize, however, that Applicant's composition and/or method may be practiced without one or more of the specific details, or with other methods, components, materials, and so forth. In other instances, well-known structures, materials, or operations are not shown or described in detail to avoid obscuring aspects of the disclosure.

In this specification and the appended claims, the singular forms "a," "an," and "the" include plural reference, unless the context clearly dictates otherwise.

Unless defined otherwise, all technical and scientific terms used herein have the same meaning as commonly understood by one of ordinary skill in the art. Although any methods and materials similar or equivalent to those described herein can also be used in the practice or testing of the present disclosure, the preferred methods and materials are now described. Methods recited herein may be carried out in any order that is logically possible, in addition to a particular order disclosed.

INCORPORATION BY REFERENCE

References and citations to other documents, such as patents, patent applications, patent publications, journals, books, papers, web contents, have been made in this disclosure. All such documents are hereby incorporated herein by reference in their entirety for all purposes. Any material, or portion thereof, that is said to be incorporated by reference herein, but which conflicts with existing definitions, statements, or other disclosure material explicitly set forth herein is only incorporated to the extent that no conflict arises between that incorporated material and the present disclosure material. In the event of a conflict, the conflict is to be resolved in favor of the present disclosure as the preferred disclosure.

EQUIVALENTS

The representative examples are intended to help illustrate the invention, and are not intended to, nor should they be construed to, limit the scope of the invention. Indeed, various modifications of the invention and many further embodiments thereof, in addition to those shown and described herein, will become apparent to those skilled in the art from the full contents of this document, including the examples and the references to the scientific and patent literature included herein. The examples contain important additional information, exemplification and guidance that can be adapted to the practice of this invention in its various embodiments and equivalents thereof.

What is claimed is:

1. A microfluidic device, comprising:
a top layer comprising a top support layer and one or more top layer(s) of graphene,
a bottom layer comprising a bottom support layer and one or more bottom layer(s) of graphene, and
a middle layer sandwiched between the top layer and the bottom layer having a patterned cavity defining a sample holding chamber,
wherein
the top layer exhibits an optically clear top window area comprising at least a portion of the top layer(s) of graphene, and
the bottom layer exhibits an optically clear bottom window area comprising at least a portion of the bottom layer(s) of graphene,
wherein
each of the top and bottom support layers comprises a thermoplastic material selected from polyester, cyclic olefin copolymer, polycarbonate and acrylic, and
the middle layer comprises a cyclic olefin copolymer.

2. The microfluidic device of claim 1, further comprising:
an inlet port in fluidic communication with the sample holding chamber; and
an outlet port in fluidic communication with the sample holding chamber.

3. The microfluidic device of claim 1, wherein the top layer and the middle layer is joined together by an adhesive layer therebetween and/or wherein the bottom layer and the middle layer is joined together by an adhesive layer therebetween.

4. The microfluidic device of claim 3, wherein the adhesive layer comprises a material selected from the group consisting of acrylic adhesive, UV-curing adhesive, and epoxy-based adhesive.

5. The microfluidic device of claim 1, wherein the top layer and the middle layer and/or the bottom layer and the middle layer are joined together via thermal bonding, solvent bonding, or surface silanization.

6. The microfluidic device of claim 1, wherein the sample holding chamber is from about 10 nL to about 10 μL in volume.

7. The microfluidic device of claim 1, having an overall thickness from about 10 μm to about 1 mm.

8. The microfluidic device of claim 1, wherein the one or more layer(s) of graphene serve as a vapor diffusion barrier to water vapor, oxygen, or both water vapor and oxygen.

9. An array device comprising two or more microfluidic devices according to claim 1.

10. An array device of claim 9, comprising from about 2 to about 1536 of the microfluidic devices.

\* \* \* \* \*